US009817310B2

(12) United States Patent
Robello et al.

(10) Patent No.: US 9,817,310 B2
(45) Date of Patent: Nov. 14, 2017

(54) BRANCHED FLUORINATED PHOTOPOLYMERS

(71) Applicant: Orthogonal, Inc., Rochester, NY (US)

(72) Inventors: Douglas Robert Robello, Webster, NY (US); Charles Warren Wright, Fairport, NY (US); Diane Carol Freeman, Pittsford, NY (US); Frank Xavier Byrne, Webster, NY (US); John Andrew DeFranco, Rochester, NY (US); Sandra Rubsam, Webster, NY (US); Terrence Robert O'Toole, Webster, NY (US)

(73) Assignee: Orthogonal, Inc., Rochester, NY (US)

( * ) Notice: Subject to any disclaimer, the term of this patent is extended or adjusted under 35 U.S.C. 154(b) by 153 days.

(21) Appl. No.: 14/539,574

(22) Filed: Nov. 12, 2014

(65) Prior Publication Data

US 2015/0132699 A1    May 14, 2015

Related U.S. Application Data

(60) Provisional application No. 61/903,450, filed on Nov. 13, 2013, provisional application No. 61/990,966, filed on May 9, 2014.

(51) Int. Cl.
*G03F 7/039* (2006.01)
*G03F 7/038* (2006.01)
*G03F 7/004* (2006.01)
*G03F 7/32* (2006.01)

(52) U.S. Cl.
CPC ............ *G03F 7/038* (2013.01); *G03F 7/0045* (2013.01); *G03F 7/0046* (2013.01); *G03F 7/0048* (2013.01); *G03F 7/0392* (2013.01); *G03F 7/0397* (2013.01); *G03F 7/325* (2013.01)

(58) Field of Classification Search
CPC ...... G03F 7/0046; G03F 7/0048; G03F 7/038; G03F 7/039; G03F 7/0045; G03F 7/0392; G03F 7/0397
See application file for complete search history.

(56) References Cited

U.S. PATENT DOCUMENTS

| | | | |
|---|---|---|---|
| 5,250,395 A * | 10/1993 | Allen | G03F 7/039 216/66 |
| 5,395,733 A | 3/1995 | Maemoto et al. | |
| 5,701,055 A | 12/1997 | Nagayama et al. | |
| 6,306,563 B1 | 10/2001 | Xu et al. | |
| 6,646,068 B2 | 11/2003 | Chrisholm et al. | |
| 6,693,296 B1 | 2/2004 | Tyan | |
| 6,884,562 B1 * | 4/2005 | Schadt, III | G03F 7/0046 430/270.1 |
| 7,261,993 B2 | 8/2007 | Schadt, III et al. | |
| 8,846,301 B2 | 9/2014 | Ober et al. | |
| 2002/0055059 A1 | 5/2002 | Nishimura et al. | |
| 2003/0211417 A1 | 11/2003 | Fryd et al. | |
| 2003/0219675 A1 | 11/2003 | Montgomery et al. | |
| 2004/0023157 A1 * | 2/2004 | Feiring | G03F 7/0045 430/272.1 |
| 2005/0042538 A1 * | 2/2005 | Babich | G03F 7/0757 430/270.1 |
| 2005/0181299 A1 | 8/2005 | Trefomas, III et al. | |
| 2007/0160930 A1 | 7/2007 | Wang et al. | |
| 2008/0160449 A1 | 7/2008 | Kubo et al. | |
| 2011/0159252 A1 | 6/2011 | Ober et al. | |
| 2012/0121858 A1 | 5/2012 | Kato | |
| 2012/0135206 A1 | 5/2012 | Haraguchi et al. | |

FOREIGN PATENT DOCUMENTS

| | | |
|---|---|---|
| EP | 1 251 399 A2 | 4/2002 |
| EP | 2 436 704 A1 | 4/2012 |
| WO | WO 2008/071662 A1 | 6/2008 |
| WO | WO 2009/143357 * | 11/2009 |
| WO | 2011/139774 A2 | 11/2011 |
| WO | WO 2012/074064 A1 | 6/2012 |
| WO | WO 2012/074076 A1 | 6/2012 |
| WO | 2012148884 A2 | 11/2012 |
| WO | 2013/077451 A1 | 5/2013 |
| WO | WO 2013/074622 A1 | 5/2013 |

OTHER PUBLICATIONS

Machine translation of WO 2012/074076, published on Jun. 7, 2012.*
International Search Report and Written Opinion for Application No. PCT/US2014/065216 dated Feb. 24, 2015.
"Office Action Issued in U.S. Appl. No. 15/296,193", dated Jan. 5, 2017, 17 pages.
Extended European Search Report for Application No. 14862385.3 dated Jul. 4, 2017.

* cited by examiner

*Primary Examiner* — Anca Eoff
(74) *Attorney, Agent, or Firm* — Merchant & Gould P.C.

(57) ABSTRACT

A fluorinated photopolymer composition is disclosed having a branched copolymer provided in a fluorinated solvent. The copolymer includes a branching unit, a first repeating unit having a fluorine-containing group, and a second repeating unit having a solubility-altering reactive group. The branched fluorinated photopolymer composition is particularly suited for the fabrication of organic electronic and bioelectronic devices, or other devices having sensitive active organic materials.

17 Claims, 3 Drawing Sheets

BRANCHED FLUORINATED PHOTOPOLYMERS

CROSS REFERENCE TO RELATED APPLICATIONS

The present application claims the benefit of U.S. Provisional Application Nos. 61/903,450, filed Nov. 13, 2013 and 61/990,966, filed May 9, 2014, both of which are incorporated herein by reference.

STATEMENT REGARDING FEDERALLY-SPONSORED RESEARCH OR DEVELOPMENT

This invention was made in part with Government support under SBIR Phase II Grant No. 1230454 awarded by the National Science Foundation (NSF). The government may have certain rights in the invention.

BACKGROUND

The present disclosure relates to branched fluorinated photopolymers. Such photopolymers are particularly useful in organic electronic and bioelectronic devices.

Photo-patternable polymeric compositions have many possible commercial applications. They can be used as photoresists, dielectrics, insulators, semiconductors, encapsulants, inert overcoats, water or oil repellent layers, light blocking or emitting layers, paints, printing inks and the like. Certain photo-patternable polymeric compositions are of particular use in the fabrication of organic electronic devices, including bioelectronic devices.

Organic electronic devices may offer certain performance and price advantages relative to conventional inorganic-based devices. As such, there has been much commercial interest in the use of organic materials in electronic device fabrication. Specifically, organic materials such as conductive polymers can be used to manufacture devices that have reduced weight and drastically greater mechanical flexibility compared to conventional electronic devices based on metals and silicon. Further, devices based on organic materials can be significantly less damaging to the environment than devices made with inorganic materials, since organic materials do not require toxic metals and can ideally be fabricated using relatively benign solvents and methods of manufacture. Thus, in light of these superior weight and mechanical properties, and particularly in light of the lowered environmental impact in fabrication and disposal, electronic devices based on organic materials are expected to be often less expensive than devices based on conventional inorganic materials.

One problem facing bioelectronic and organic electronic devices is that the materials and patterning processes used for conventional inorganic electronics are often not compatible with biological and chemical electronic materials. Thus, new materials and processes are needed.

For example, although the use of photoresists is routine in the patterning of traditional electronic devices based on inorganic materials, photolithographic patterning has been difficult when applied to bioelectronic or organic electronic materials. Specifically, bioelectronic and organic electronic materials are often much less resistant to the solvents that are used for conventional photolithography, with the result that conventional lithographic solvents and processes tend to degrade organic electronics. Although there have been various attempts to overcome these problems, e.g., by ink jet printing or shadow mask deposition, these alternative methods do not produce the same results as would be obtained with successful photolithography. Neither ink jet printing nor shadow mask deposition can generally achieve the fine pattern resolutions that can be obtained by conventional lithography.

U.S. Pat. No. 8,846,301 discloses a useful method for patterning organic electronic materials by an "orthogonal" process that uses fluorinated solvents and fluorinated photoresists. The fluorinated solvents were found to have very low interaction with organic electronic materials. WO 2012/148884 discloses additional fluorinated material sets for orthogonal processing. Although the orthogonal process has made good progress, the disclosed systems have yet to be commercially adopted. Further improvements in system performance and cost are desired.

SUMMARY

The authors have found that orthogonal fluorinated photopolymer systems are sometimes challenged with low rates of development or stripping in fluorinated solvents. As photopolymer formulations advance to include additional functionality and higher sensitivity, the issue has become more significant. Longer developing and stripping times will result in lower manufacturing throughput. Further, although fluorinated solvents have low interaction with many useful active organic materials, increased solvent exposure due to long developing or stripping times may in some cases eventually lead to unwanted degradation of the active material performance.

In accordance with the present disclosure, a fluorinated photopolymer composition comprises: a branched copolymer comprising a branching unit, a first repeating unit having a fluorine-containing group, and a second repeating unit having a solubility-altering reactive group; and a fluorinated solvent.

In accordance with another aspect of the present disclosure, a method of patterning a device comprises: forming a photopolymer layer on a device substrate, the photopolymer layer including a branched copolymer comprising a branching unit having at least two branch points, a first repeating unit having a fluorine-containing group, and a second repeating unit having a solubility-altering reactive group; exposing the photopolymer layer to patterned radiation to form an exposed photopolymer layer; and contacting the exposed photopolymer layer with a developing agent to remove a portion of the exposed photopolymer layer in accordance with the patterned light, thereby forming a developed structure having a first pattern of photopolymer covering the device substrate and a complementary second pattern of uncovered substrate corresponding to the removed portion of photopolymer, the developing agent comprising a first fluorinated solvent.

In certain embodiments, the photopolymer compositions of the present disclosure have improved development rates in developing agents based on fluorinated solvents. In certain embodiments, the photopolymer compositions of the present disclosure have improved stripping rates in stripping agents based on fluorinated solvents. In certain embodiments, the photopolymer compositions of the present disclosure have improved develop/strip exposure latitude. In certain embodiments, the photopolymer compositions of the present disclosure have improved contrast. In certain embodiments, the photopolymer compositions of the present disclosure have improved photosensitivity. In certain embodiments, the branched copolymers of the present disclosure enable higher levels of sensitizing dyes, polar groups or etch resistant groups to be incorporated into the copolymer. In certain embodiments, the branched copolymers of the present disclosure enable a wide range of photopolymer formulations that remain compatible with orthogonal fluorinated solvents.

DETAILED DESCRIPTION

Figure 1:
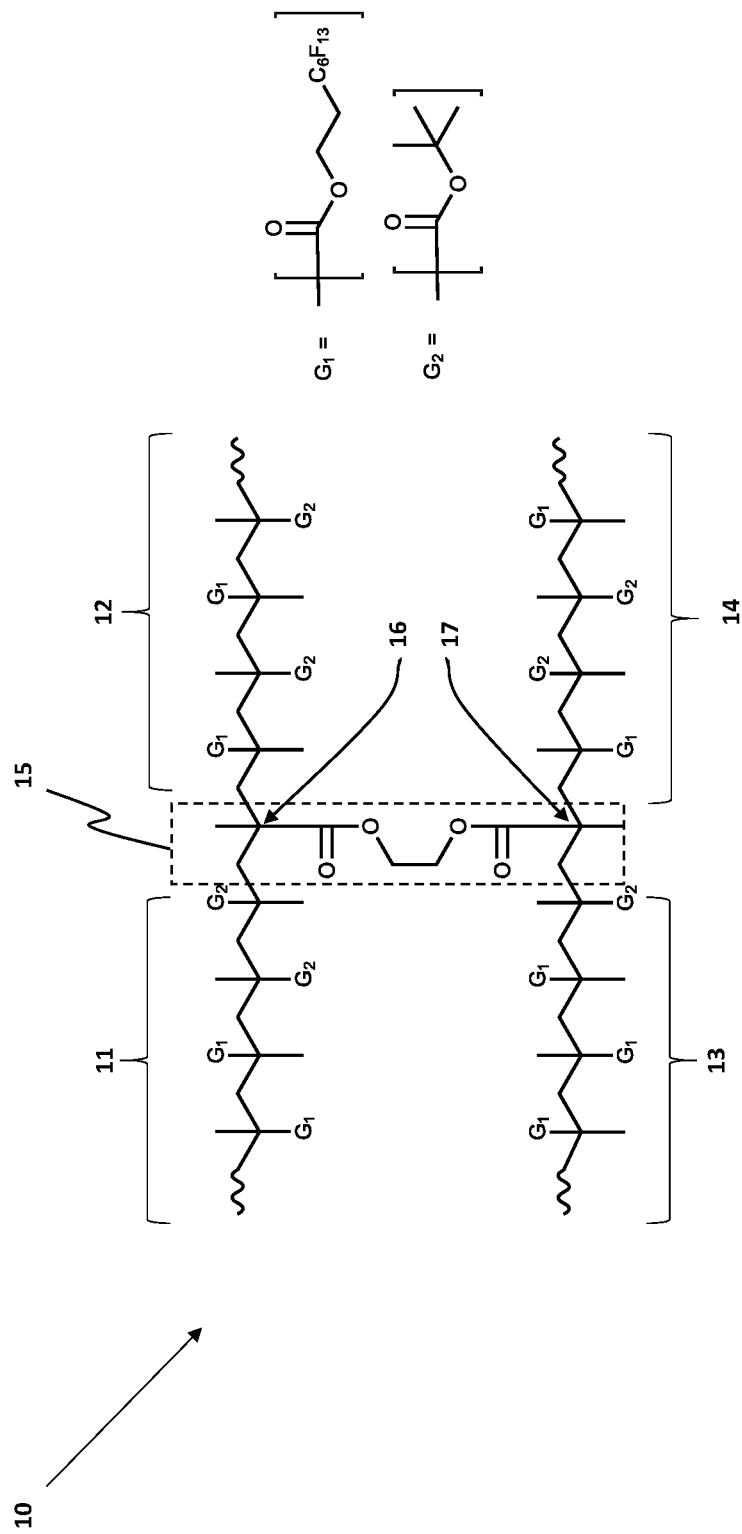
FIG. 1 illustrates a representative branched copolymer of the present disclosure.

A photosensitive composition (also referred to herein as a photopolymer composition) includes a light-sensitive material that can be coated or applied in some way to produce a photocurable film, e.g., a photo-patternable film. In an embodiment, photopolymers of the present disclosure may be used as a photoresist to pattern a layer of some useful material in a device, e.g., a multilayer electronic device, and the photopolymer may optionally be removed (stripped). In an embodiment, photopolymers of the present disclosure may remain as part of a device and be used to form, e.g., a patterned a dielectric film or a water and/or oil repellent structure. The photopolymer is particularly suited for coating and developing using fluorinated solvents. The solvents for the fluorinated photopolymer solution, the optional developing agent and optional stripping agent are each chosen to have low interaction with other material layers that are not intended to be dissolved or otherwise damaged. Such solvents and solutions are collectively termed "orthogonal". This can be tested by, for example, immersion of a device comprising the material layer of interest into the solvent or solution prior to operation. The solvent is orthogonal if there is no serious reduction in the functioning of the device. Unless otherwise noted, the term "solution" is used broadly herein to mean any flowable material. Examples of "solutions" include, but are not limited to: single solvent liquids; homogeneous mixtures of a solvent with one or more other solvents, with one or more solutes, and combinations thereof; and heterogeneous or multi-phase mixtures such as emulsions, dispersions and the like.

Certain embodiments disclosed in the present disclosure are particularly suited to devices using solvent-sensitive, active organic materials. Examples of active organic materials include, but are not limited to, organic electronic materials, such as organic semiconductors, organic conductors, OLED (organic light-emitting diode) materials and organic photovoltaic materials, organic optical materials and biological materials (including bioelectronic and bioactive materials). Many of these materials are easily damaged when contacted with organic or aqueous solutions used in conventional photolithographic processes. Active organic materials are often coated to form a layer that may be patterned. For some active organic materials, such coating can be done from a solution using conventional methods. Alternatively, some active organic materials are coated by vapor deposition, for example, by sublimation from a heated organic material source at reduced pressure. Solvent-sensitive, active organic materials also includes composites of organics and inorganics. For example, the composite may include inorganic semiconductor nanoparticles (quantum dots). Such nanoparticles may have organic ligands or be dispersed in an organic matrix.

The photopolymer compositions of the present disclosure are provided in a coating solvent that typically includes at least 50% by volume of a fluorinated solvent, preferably at least 90% by volume relative to the total solvent volume. If a deposited layer is intended to be photo-patterned, a pattern-exposed photopolymer layer can be developed using a developing agent capable of discriminating between exposed and unexposed areas. In an embodiment, the developing agent includes at least 50% by volume of a fluorinated solvent(s), preferably at least 90% by volume relative to the total volume of the developing agent. Similarly, a developed (patterned) photopolymer layer can optionally be stripped using a stripping agent capable of dissolving or lifting off the exposed photopolymer. In an embodiment, the stripping agent includes at least 50% by volume of a fluorinated solvent(s), alternatively at least 90% by volume relative to the total volume of stripping agent. Depending on the particular material set and solvation needs of the process, the fluorinated solvent may be selected from a broad range of materials such as chlorofluorocarbons (CFCs), hydrochlorofluorocarbons (HCFCs), hydrofluorocarbons (HFCs), perfluorocarbons (PFCs), hydrofluoroethers (HFEs), perfluoroethers, perfluoroamines, trifluoromethyl-substituted aromatic solvents, fluoroketones and the like.

Particularly useful fluorinated solvents include those that are perfluorinated or highly fluorinated liquids at room temperature, which are immiscible with water and most (but not necessarily all) organic solvents. Among those solvents, hydrofluoroethers (HFEs) are well known to be highly environmentally friendly, "green" solvents. HFEs, including segregated HFEs, are preferred solvents because they are non-flammable, have zero ozone-depletion potential, lower global warming potential than PFCs and show very low toxicity to humans.

Examples of readily available HFEs and isomeric mixtures of HFEs include, but are not limited to, an isomeric mixture of methyl nonafluorobutyl ether and methyl nonafluoroisobutyl ether (HFE-7100), an isomeric mixture of ethyl nonafluorobutyl ether and ethyl nonafluoroisobutyl ether (HFE-7200 aka Novec™ 7200), 3-ethoxy-1, 1,1,2,3,4,4,5,5,6,6,6-dodecafluoro-2-trifluoromethyl-hexane (HFE-7500 aka Novec™ 7500), 1,1,1,2,3,3-hexafluoro-4-(1,1,2,3,3,3,-hexafluoropropoxy)-pentane (HFE-7600 aka Novec™ 7600), 1-methoxyheptafluoropropane (HFE-7000), 1,1,1,2,2,3,4,5,5,5-decafluoro-3-methoxy-4-trifluoromethylpentane (HFE-7300 aka Novec™ 7300), 1,3-(1,1,2,2-tetrafluoroethoxy)benzene (HFE-978m), 1,2-(1,1,2,2-tetrafluoroethoxy)ethane (HFE-578E), 1,1,2,2-tetrafluoroethyl-1H,1H,5H-octafluoropentyl ether (HFE-6512), 1,1,2,2-tetrafluoroethyl-2,2,2-trifluoroethyl ether (HFE-347E), 1,1,2,2-tetrafluoroethyl-2,2,3,3-tetrafluoropropyl ether (HFE-458E), 2,3,3,4,4-pentafluorotetrahydro-5-methoxy-2,5-bis[1,2,2,2-tetrafluoro-1-(trifluoromethyl)ethyl]-furan (HFE-7700 aka Novec™ 7700) and 1,1,1,2,2,3,3,4,4,5,5,6,6-tridecafluorooctane-propyl ether (TE60-C3).

Mixtures of fluorinated solvents may optionally be used, e.g., as disclosed in U.S. patent application Ser. Nos. 14/260,666 and 14/260,705, the entire contents of which are incorporated by reference herein.

The fluorinated photopolymer compositions of the present disclosure include a fluorinated solvent and a branched copolymer comprising a branching unit, a first repeating unit having a fluorine-containing group, and a second repeating unit having a solubility-altering reactive group. In an embodiment, the branched copolymer has a total fluorine content in a weight range of 10 to 60%, or alternatively 10 to 55%, or alternatively 20 to 55%, or alternatively 20 to 50%. The term copolymer includes oligomers in addition to higher MW polymers. In an embodiment, the MW of the branched copolymer is at least 2500 daltons, or in another embodiment at least 5000 daltons, or in another embodiment, at least 10,000 daltons. The copolymer is suitably a random copolymer, but other copolymer types can be used, e.g., block copolymers, alternating copolymers, graft copolymers and periodic copolymers. The term "repeating unit" is used broadly herein and simply means that there is more than one unit. The term is not intended to convey that there is necessarily any particular order or structure with respect to the other repeating units unless specified otherwise. When a repeating unit represents a low mole % of the combined repeating units, there may be only one such unit on a polymer chain. The copolymer may optionally be blended with one or more other polymers, preferably other fluorine-containing polymers, branched or unbranched. The total fluorine content of the blended polymers may suitably be in a weight range of 10 to 60%, or alternatively 20 to 55%, relative to the total weight of the blended polymers.

The term "branched polymer" refers to a polymer chain having at least one branching unit that forms one or more branch points connecting three or more chain segments. A branched copolymer of the present disclosure may be a brush/comb type, a star type, a hyperbranched type, dendrimer type or any other known in the art. The branched copolymer may simply have three chain segments or many more. A generic structure is shown below as branched polymer (A):

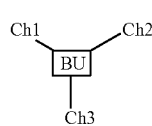

(A)

wherein Ch1 is a first chain segment, Ch2 is a second chain segment, Ch3 is a third chain segment and BU is a branching unit. In an embodiment, the branching unit may be conveniently defined as a single atom capable of bonding to at least three polymer chain segments, e.g., a carbon, nitrogen, silicon or aluminum atom. In an embodiment, the branching unit may be conveniently defined as a chemical compound, typically a compound having multiple polymerizable groups or other functional groups capable of forming branch points.

In an embodiment, at least one of the two specified repeat units is formed via a post-polymerization reaction. In this embodiment, an intermediate branched polymer (a precursor to the desired copolymer) is first prepared, said intermediate branched polymer comprising suitably reactive functional groups for forming one of more of the specified repeat units. For example, an intermediate polymer containing pendant carboxylic acid moieties can be reacted with a fluorinated alcohol compound in an esterification reaction to produce the specified fluorinated repeating unit. Similarly, a precursor branched polymer containing an alcohol can be reacted with a suitably derivatized glycidyl moiety to form an acid-catalyzed cross-linkable (epoxy-containing) repeating unit as the solubility-altering reactive group. In another example, a polymer containing a suitable leaving group such as primary halide can be reacted with an appropriate compound bearing a phenol moiety to form the desired repeat unit via an etherification reaction. In addition to simple condensation reactions such as esterification and amidation, and simple displacement reactions such as etherification, a variety of other covalent-bond forming reactions well-known to practitioners skilled in the art of organic synthesis can be used to form any of the specified repeat units. Examples include palladium-catalyzed coupling reactions, "click" reactions, addition to multiple bond reactions, Wittig reactions, reactions of acid halides with suitable nucleophiles, and the like.

In an embodiment, a functionalized linear or branched polymer may undergo grafting whereby polymer chains comprising the repeating units are formed or attached at the functional groups, thereby forming the branched copolymer. This embodiment may, for example, be used to form comb type branched copolymers.

In an embodiment, the copolymer is formed directly by polymerization of appropriate monomers, rather than by attachment to an intermediate polymer. Although many of the embodiments below refer to polymerizable monomers, analogous structures and ranges are contemplated and within the scope of the present disclosure wherein one or more of the first and second repeating units are formed instead by attachment to an intermediate polymer as described above.

In an embodiment, the fluorinated photopolymer material includes a copolymer formed at least from a first monomer having a fluorine-containing group, a second monomer having a solubility-altering reactive group and a branching monomer having at least two polymerizable sites.

The first monomer is one capable of being copolymerized with the second monomer and the branching monomer, and has at least one fluorine-containing group. In an embodiment, at least 70% of the fluorine content of the copolymer (by weight) is derived from the first monomer. In another embodiment, at least 85% of the fluorine content of the copolymer (by weight) is derived from the first monomer.

The first monomer includes a polymerizable group and a fluorine-containing group. The polymerizable group may, for example, be polymerized by step-growth polymerization using appropriate functional groups or by a chain polymerization such as radical polymerization. Some non-limiting examples of useful radical polymerizable groups include acrylates (e.g. acrylate, methacrylate, cyanoacrylate and the like), acrylamides, vinylenes (e.g., styrenes), vinyl ethers and vinyl esters. In an embodiment, the polymerizable group includes one or more fluorine atoms (e.g., a fluorinated vinyl moiety), and the polymerizable group in this case may also be considered to be a fluorine-containing group. The fluorine-containing group of the first monomer or the first repeating unit is preferably a fluorine-containing alkyl or aryl group that may optionally be further substituted with chemical moieties other than fluorine, e.g., chlorine, a cyano group, or a substituted or unsubstituted alkyl, alkoxy, alkylthio, aryl, aryloxy, amino, alkanoate, benzoate, alkyl ester, aryl ester, alkanone, sulfonamide or monovalent heterocyclic group, or any other substituent that a skilled worker would readily contemplate that would not adversely affect the performance of the fluorinated photopolymer. Throughout this disclosure, unless otherwise specified, any use of the term alkyl includes straight-chain, branched and cyclo alkyls. In an embodiment, the first monomer does not contain protic or charged substituents, such as hydroxy, carboxylic acid, sulfonic acid or the like.

In a preferred embodiment, the first monomer has a structure according to formula (1):

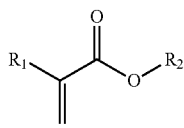

(1)

In formula (1), $R_1$ represents a hydrogen atom, a cyano group, a methyl group or an ethyl group. $R_2$ represents a fluorine-containing group, in particular, a substituted or unsubstituted alkyl group having at least 5 fluorine atoms, preferably at least 10 fluorine atoms. In an embodiment, the alkyl group is a cyclic or non-cyclic hydrofluorocarbon or hydrofluoroether having at least as many fluorine atoms as carbon atoms. In a preferred embodiment $R_2$ represents a perfluorinated alkyl or a 1H,1H,2H,2H-perfluorinated alkyl having at least 4 carbon atoms. An example of the latter is 1H,1H,2H,2H-perfluorooctyl methacrylate ("FOMA").

A combination of multiple first monomers or first repeating units having different fluorine-containing groups may be used. The total mole ratio of first monomers relative to all of the monomers of the copolymer may be in a range of 5 to 80%, or alternatively 10 to 70%, or alternatively 20 to 60%.

The second monomer is one capable of being copolymerized with the first monomer and the branching monomer. The second monomer includes a polymerizable group and a solubility-altering reactive group. Some non-limiting examples of useful polymerizable groups include those described for the first monomer.

In an embodiment, the solubility-altering reactive group of the second monomer or second repeating unit is an acid-forming precursor group. Upon exposure to light, the acid-forming precursor group generates a polymer-bound acid group, e.g., a carboxylic or sulfonic acid. This can drastically change its solubility relative to the unexposed regions thereby allowing development of an image with the appropriate solvent. In an embodiment, the developing agent includes a fluorinated solvent that selectively dissolves unexposed areas. In an alternative embodiment, the developing agent includes a polar solvent that selectively dissolves the exposed areas. In an embodiment, a carboxylic acid-forming precursor is provided from a monomer in a weight percentage range of 4 to 40% relative to the copolymer.

One class of acid-forming precursor groups includes the non-chemically amplified type (i.e., non-acid catalyzed). An example of a second monomer with such a group is 2-nitrobenzyl methacrylate. The non-chemically amplified precursor group may directly absorb light to initiate de-protection of the acid-forming groups. Alternatively, a sensitizing dye may be added to the composition whereby the sensitizing dye absorbs light and forms an excited state capable of directly sensitizing or otherwise initiating the de-protection of acid-forming precursor groups. The sensitizing dye may be added as a small molecule or it may be attached or otherwise incorporated as part of the copolymer. Unlike chemically amplified formulations that rely on generation of an acid (see below), non-chemically amplified photopolymers may sometimes be preferred when a photopolymer is used in contact with an acid-sensitive or acid-containing material.

A second class of acid-forming precursor groups includes the chemically amplified type. This typically requires addition of a photo-acid generator (PAG) to the photopolymer composition, e.g., as a small molecule additive to the solution. The PAG may function by directly absorbing radiation (e.g. UV light) to cause decomposition of the PAG and release an acid. Alternatively, a sensitizing dye may be added to the composition whereby the sensitizing dye absorbs radiation and forms an excited state capable of reacting with a PAG to generate an acid. The sensitizing dye may be added as a small molecule, e.g., as disclosed in U.S. patent application Ser. No. 14/335,476, which is incorporated herein by reference. The sensitizing dye may be attached to or otherwise incorporated as part of the copolymer, e.g., as disclosed in U.S. patent application Ser. Nos. 14/291,692 and 14/291,767, which are incorporated herein by reference. In an embodiment, the sensitizing dye (either small molecule or attached) is fluorinated. In an embodiment, the sensitizing dye may be provided in a range of 0.5 to 10% by weight relative to the total copolymer weight. The photochemically generated acid catalyzes the de-protection of acid-labile protecting groups of the acid-forming precursor. In some embodiments, chemically amplified photopolymers can be particularly desirable since they enable the exposing step to be performed through the application of relatively low energy UV light exposure. This is advantageous since some active organic materials useful in applications to which the present disclosure pertains may decompose in the presence of UV light, and therefore, reduction of the energy during this step permits the photopolymer to be exposed without causing significant photolytic damage to underlying active organic layers. Also, reduced light exposure times improve the manufacturing throughput of the desired devices.

Examples of acid-forming precursor groups that yield a carboxylic acid include, but are not limited to: A) esters capable of forming, or rearranging to, a tertiary cation, e.g., t-butyl ester, t-amyl ester, 2-methyl-2-adamantyl ester, 1-ethylcyclopentyl ester, and 1-ethylcyclohexyl ester; B) esters of lactone, e.g., γ-butyrolactone-3-yl, γ-butyrolactone-2-yl, mevalonic lactone, 3-methyl-γ-butyrolactone-3-yl, 3-tetrahydrofuranyl, and 3-oxocyclohexyl; C) acetal esters, e.g., 2-tetrahydropyranyl, 2-tetrahydrofuranyl, and 2,3-propylenecarbonate-1-yl; D) beta-cyclic ketone esters, E) alpha-cyclic ether esters; and F) MEEMA (methoxy ethoxy ethyl methacrylate) and other esters which are easily hydrolyzable because of anchimeric assistance. In an embodiment, the second monomer comprises an acrylate-based polymerizable group and a tertiary alkyl ester acid-forming precursor group, e.g., t-butyl methacrylate ("TBMA") or 1-ethylcyclopentyl methacrylate ("ECPMA").

In an embodiment, the solubility-altering reactive group is an hydroxyl-forming precursor group (also referred to herein as an "alcohol-forming precursor group"). The hydroxyl-forming precursor includes an acid-labile protecting group and the photopolymer composition typically includes a PAG compound and operates as a "chemically amplified" type of system. Upon exposure to light, the PAG generates an acid (either directly or via a sensitizing dye as described above), which in turn, catalyzes the deprotection of the hydroxyl-forming precursor group, thereby forming a polymer-bound alcohol (hydroxyl group). This significantly changes its solubility relative to the unexposed regions thereby allowing development of an image with the appropriate solvent (typically fluorinated). In an embodiment, the developing agent includes a fluorinated solvent that selectively dissolves unexposed areas. In an alternative embodiment, the developing agent includes a polar solvent that selectively dissolves the exposed areas. In an embodiment, an hydroxyl-forming precursor is provided from a monomer in a weight percentage range of 4 to 40% relative to the copolymer.

In an embodiment, the hydroxyl-forming precursor has a structure according to formula (2):

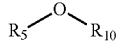
(2)

wherein $R_5$ is a carbon atom that forms part of the second repeating unit or second monomer, and $R_{10}$ is an acid-labile protecting group. Non-limiting examples of useful acid-labile protecting groups include those of formula (AL-1), acetal groups of the formula (AL-2), tertiary alkyl groups of the formula (AL-3) and silane groups of the formula (AL-4).

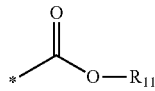
(AL-1)

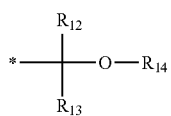
(AL-2)

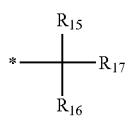
(AL-3)

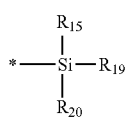
(AL-4)

In formula (AL-1), $R_{11}$ is a monovalent hydrocarbon group, typically a straight, branched or cyclic alkyl group, of 1 to 20 carbon atoms that may optionally be substituted with groups that a skilled worker would readily contemplate would not adversely affect the performance of the precursor. In an embodiment, $R_{11}$ may be a tertiary alkyl group. Some representative examples of formula (AL-1) include:

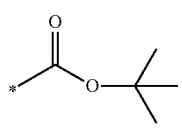
AL-1-1

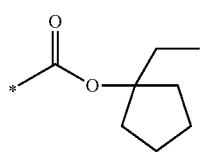
AL-1-2

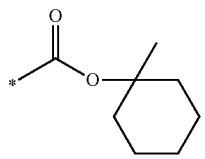
AL-1-3

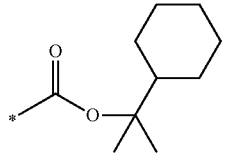
AL-1-4

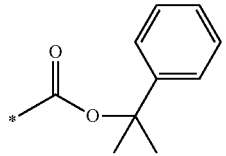
AL-1-5

In formula (AL-2), $R_{14}$ is a monovalent hydrocarbon group, typically a straight, branched or cyclic alkyl group, of 1 to 20 carbon atoms that may optionally be substituted. $R_{12}$ and $R_{13}$ are independently selected hydrogen or a monovalent hydrocarbon group, typically a straight, branched or cyclic alkyl group, of 1 to 20 carbon atoms that may optionally be substituted. Some representative examples of formula (AL-2) include:

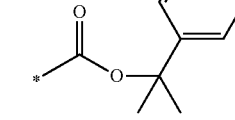
AL-2-1

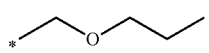
AL-2-2

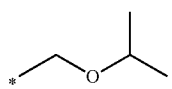
AL-2-3

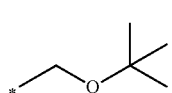
AL-2-4

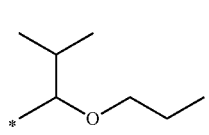
AL-2-5

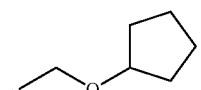
AL-2-6

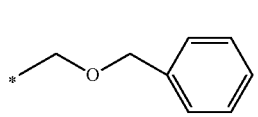
AL-2-7

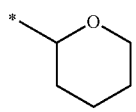

In formula (AL-3), $R_{15}$, $R_{16}$, and $R_{17}$ represent an independently selected a monovalent hydrocarbon group, typically a straight, branched or cyclic alkyl group, of 1 to 20 carbon atoms that may optionally be substituted. Some representative examples of formula (AL-3) include:

AL-3-1
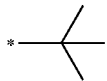

AL-3-2
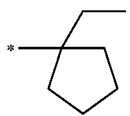

AL-3-3
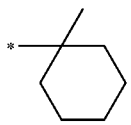

AL-3-4
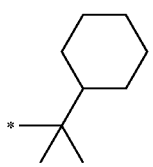

AL-3-5
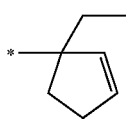

AL-3-6
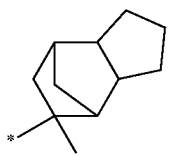

In formula (AL-4), $R_{18}$, $R_{19}$ and $R_{20}$ are independently selected hydrocarbon groups, typically a straight, branched or cyclic alkyl group, of 1 to 20 carbon atoms that may optionally be substituted.

The descriptions of the above acid-labile protecting groups for formulae (AL-2), (AL-3) and (AL-4) have been described in the context of hydroxyl-forming precursors. These same acid-labile protecting groups, when attached instead to a carboxylate group, may also be used to make some of the acid-forming precursor groups described earlier.

In an embodiment, the solubility-altering reactive group is a cross-linkable group, e.g., an acid-catalyzed cross-linkable group or a photo cross-linkable (non-acid catalyzed) group. Photo cross-linkable groups typically have at least one double bond so that when the group forms an excited state (either by direct absorption of light or by excited state transfer from a sensitizing dye), sets of double bonds from adjacent polymer chains crosslink. In an embodiment, the photo cross-linkable group (not catalyzed) comprises a cinnamate that may optionally further include fluorine-containing substituents, as described in U.S. Provisional Application No. 61/937,122, the contents of which are incorporated herein. Some non-limiting examples of polymerizable monomers including such cinnamates are shown below.

(C-1)
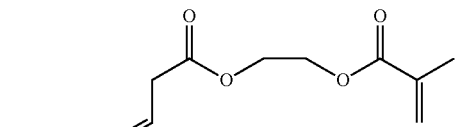

(C-2)
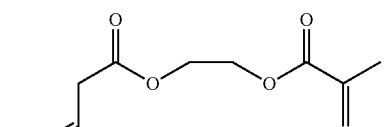

(C-3)
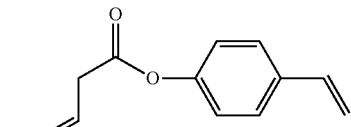

(C-4)
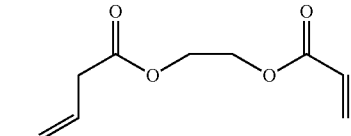

(C-5)
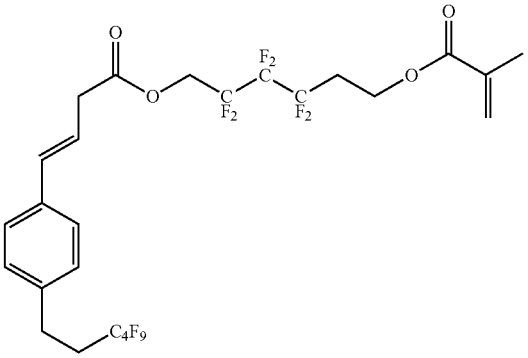

13
-continued

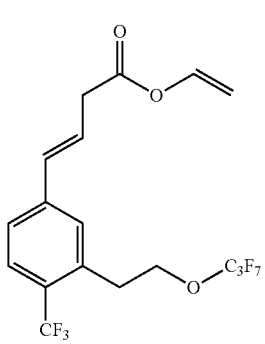
(C-6)

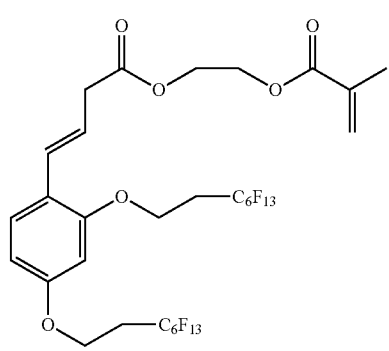
(C-7)

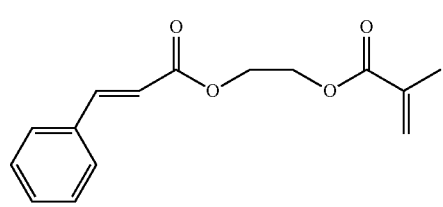
(C-8)

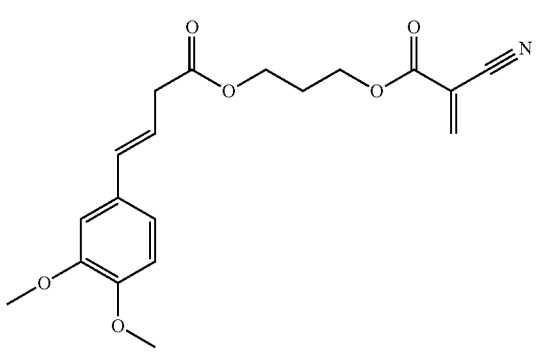
(C-9)

Compositions comprising such materials may optionally further include a sensitizing dye. Some non-limiting examples of useful sensitizing dyes for cinnamate cross-linking groups include diaryl ketones (e.g., benzophenones), arylalkyl ketones (e.g., acetophenones), diaryl butadienes, diaryl diketones (e.g. benzils), xanthones, thioxanthones, naphthalenes, anthracenes, benzanthrone, phenanthrenes, crysens, anthrones, 5-nitroacenapthene, 4-nitroaniline, 3-nitrofluorene, 4-nitromethylaniline, 4-nitrobiphenyl, picramide, 4-nitro-2,6-dichlorodimethylaniline, Michler's ketone, N-acyl-4-nitro-1-naphthylamine.

Examples of acid-catalyzed cross-linkable groups include, but are not limited to, cyclic ether groups and vinyloxy groups. In an embodiment, the cyclic ether is an epoxide or an oxetane. The photopolymer composition including an acid-catalyzed cross-linkable group typically

14 includes a PAG compound and operates as a "chemically amplified" type of system in a manner described above. Upon exposure to light, the PAG generates an acid (either directly or via a sensitizing dye as described above), which in turn, catalyzes the cross-linking of the acid-catalyzed cross-linkable groups. This significantly changes its solubility relative to the unexposed regions thereby allowing development of an image with the appropriate fluorinated solvent. Usually, cross-linking reduces solubility. In an embodiment, the developing agent includes a fluorinated solvent that selectively dissolves unexposed areas. In an embodiment, a cross-linkable group is provided from a monomer in a weight percentage range of 4 to 40% relative to the copolymer.

Some non-limiting examples of some acid-catalyzed cross-linkable groups include the following wherein (*) refers to an attachment site to the polymer or the polymerizable group of a monomer:

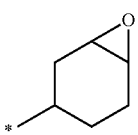
(CL-1)

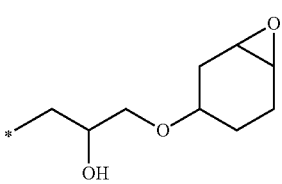
(CL-2)

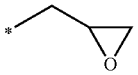
(CL-3)

(CL-4)

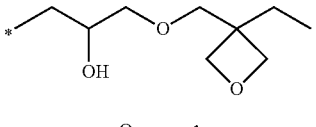
(CL-5)

(CL-6)

In an embodiment, the solubility-altering reactive groups are ones that, when the photopolymer composition or layer is exposed to light, undergo a bond-breaking reaction to form a material with higher solubility in fluorinated solvents. For example, the solubility-altering reactive groups could be cross-linked and the links are broken upon exposure to light thereby forming lower molecular weight materials. In this embodiment, a fluorinated solvent may be selected to selectively remove exposed areas, thereby acting as a positive photopolymer system.

A combination of multiple second monomers or second repeating units having different solubility-altering reactive groups may be used. For example, a fluorinated photopolymer may comprise both acid-forming and an alcohol-forming precursor groups.

In an embodiment, the branching unit is provided by a branching monomer having at least two polymerizable sites capable of being copolymerized with the first monomer and second monomer. Some non-limiting examples of useful polymerizable groups include those described for the first monomer. Some representative examples of branching monomers include: aliphatic or alicyclic divinyl hydrocarbons such as isoprene, butadiene, 3-methyl-1,2-butadiene, 2,3-dimethyl-1,3-butadiene, 1,2-polybutadiene, pentadiene, hexadiene, octadiene, cyclopentadiene, cyclohexadiene, cyclooctadiene, norbornadiene, and the like; aromatic divinyl hydrocarbons such as divinylbenzene, divinyltoluene, divinylxylene, trivinylbenzene, divinylbiphenyl, divinylnaphthalene, divinylfluorene, divinylcarbazole, divinylpyridine, and the like; divinyl and diallyl esters such as divinyl adipate, divinyl maleate, divinyl phthalate, divinyl isophthalate, divinyl itaconate, vinyl(meth)acrylate, diallyl maleate, diallyl phthalate, diallyl isophthalate, diallyl adipate, allyl (meth)acrylate, and the like; divinyl and diallyl ethers such as diallyl ether, diallyloxyethane, triallyloxyethane, tetraallyloxyethane, tetraallyloxypropane, tetraallyloxybutane, tetramethallyloxyethan; divinyl ether, diethylene glycol divinyl ether, triethylene glycol divinyl ether, and the like; divinyl ketones; diallyl ketones; fluorine-containing divinyl compounds such as 1,4-divinylperfluorobutane, 1,6-divinylperfluorohexane, 1,8-divinylperfluorooctane, and the like; nitrogen-containing divinyl compounds such as diallylamine, diallylisocyanurate, diallylcyanurate, methylen-ebis(meth)acrylamide, bismaleimide, and the like; silicon-containing divinyl compound such as dimethyldivinylsilane, divinylmethylphenylsilane, diphenyldivinylsilane, 1,3-divinyl-1,1,3,3-tetramethyldisilazane, 1,3-divinyl-1,1,3,3-tetraphenyldisilazane, diethoxyvinylsilane, and the like.

In a preferred embodiment, the branching monomer having at least two polymerizable sites are based on (meth)acrylic acid esters such as ethylene glycol di(meth)acrylate (EGD(M)A), triethylene glycol di(meth)acrylate, propylene glycol di(meth)acrylate, neopentyl glycol di(meth)acrylate, trimethylolpropane tri(meth)acrylate, ditrimethylolpropane tetra(meth)acrylate, glycerol tri(meth)acrylate, pentaerythritol tetra(meth)acrylate, alkoxytitanium tri(meth)acrylate, 1,6-hexanediol di(meth)acrylate, 2-methyl-1,8-octanediol di(meth)acrylate, 1,9-nonanediol di(meth)acrylate, 1,10-decanediol di(meth)acrylate, tricyclodecanedimethanol di(meth)acrylate, dioxane glycol di(meth)acrylate, 2-hydroxy-1-acryloyloxy-3-methacryloyloxypropane, 2-hydroxy-1,3-di(meth)acryloyloxypropane, 9,9-bis[4-(2-(meth)acryloyloxyethoxy)phenyl]fluorene, undecylenoxy ethyleneglycol di(meth)acrylate, bis[4-(meth)acryloylthiophenyl]sulfide, bis[2-(meth)acryloylthioethyl]sulfide, 1,3-adamantanediol di(meth)acrylate, 1,3-adamantanedimethanol di(meth)acrylate, and the like.

A combination of multiple branching monomers or branching units having different chemical structures may be used. In an embodiment, the mole % of branching units relative to the total of all copolymer units is in a range of 0.5 to 10%, or alternatively 1 to 10%, or alternatively 1 to 6%, or alternatively 2 to 6%.

Methods of polymerization are known in the art. Some useful examples of the preparation of orthogonal photoresists can be found in U.S. Pat. No. 8,846,301, U.S. patent application Ser. No. 14/113,408, and U.S. patent application Ser. No. 14/291,692, the entire contents of which are incorporated herein by reference. The presence of branching monomers requires some care to prevent excessive cross-linking resulting in a totally insoluble polymer. Methods for preparing branched polymers by radical polymerization can be found, for example, in U.S. Pat. No. 6,646,068 and US Publication No. 2012/0135206, the contents of which are incorporated by reference. In an embodiment, chain transfer agents are used in conjunction with a radical polymerization initiator to control branching.

Non-limiting examples of useful chain transfer agents include thiols such as alkyl mercaptans (e.g., dodecyl mercaptan), alkyl thioglycolates (e.g., 2-ethyl hexyl thioglycolate), polyfunctional thiols, and brominated compounds such as carbon tetrabromide. In the polymerization reaction, a thiol type chain transfer agent may terminate polymerization of a chain segment by addition of a thiol radical to form a sulfur-containing terminal group, e.g., a thioether. In the case of carbon tetrabromide, a chain segment-terminating bromine or a bromine-containing group may be formed. In an embodiment, chain transfer agent is provided into the reaction vessel in a mol ratio relative to the branching monomer in a range of 0.05 to 10, or in another embodiment in a range of 0.1 to 5, or in another embodiment 0.5 to 2.

Typical free-radical initiators include azo compounds, peroxides and peroxyesters. Azo compounds are generally preferred. In an embodiment, the initiator is provided into the reaction vessel in a mol ratio relative to the branching monomer in a range of 0.05 to 5, or in another embodiment in a range of 0.1 to 2, or in another embodiment 0.5 to 1. If used with a charge transfer agent, the mol ratio of initiator relative to the charge transfer agent may be in a range of 0.05 to 10, or in another embodiment in a range of 0.1 to 5, or in another embodiment 0.5 to 2.

The branched copolymer may optionally include additional repeating units having other functional groups. For example, the copolymer may optionally include a repeating unit that adjusts some photopolymer or film property (e.g., solubility, Tg, light absorption, sensitization efficiency, adhesion, surface wetting, etch resistance, dielectric constant and the like).

A non-limiting example of a branched polymer is shown in FIG. 1 for discussion purposes. In this example, a random branched copolymer 10 has been prepared by copolymerizing a first monomer (FOMA) having the fluorine-containing group (G1), a second monomer (TBMA) having the solubility-altering reactive group (G2) and a branching monomer (EGDMA) having at least two polymerizable sites. The polymerized EGDMA forms a branching unit 15 having branch points 16 and 17 that connect four polymer chain segments 11, 12, 13 and 14. Although it is convenient and accurate to define the branching unit 15 as shown in FIG. 1, it will be appreciated by those skilled in the art that the carbon atom at branch point 16 may also be considered a branching unit, as it connects chain segments 11 and 12 to chain segments 13 and 14 via the bridging EGDMA fragment. Similarly, branch point 17 may also be considered a branching unit.

Many useful PAG compounds exist that may be added to a photopolymer composition. In the presence of proper exposure and optional sensitization, this photo-acid generator will liberate an acid, which will react with the second monomer portion of the fluorinated photopolymer material to transform it into a less soluble form with respect to fluorinated solvents. The PAG needs to have some solubility in the coating solvent. The amount of PAG required depends upon the particular system, but generally, will be in a range of about 0.1 to 6% by weight relative to the copolymer. In an embodiment, the presence of a sensitizing dye may substantially reduce the amount of PAG required relative to a composition that does not include a sensitizing dye. In an embodiment, the amount of PAG is in a range of 0.1 to 3% relative to the copolymer. Fluorinated PAGs are generally preferred and non-ionic PAGs are particularly useful. Some useful examples of PAG compounds include 2-[2,2,3,3,4,4,5,5-octafluoro-1-(nonafluorobutylsulfonyloxyimino)-pentyl]-fluorene (ONPF) and 2-[2,2,3,3,4,4,4-heptafluoro-1-(nonafluorobutylsulfonyloxyimino)-butyl]-fluorene (HNBF). Other non-ionic PAGS include: norbornene-based non-ionic PAGs such as N-hydroxy-5-norbornene-2,3-dicarboximide perfluorooctanesulfonate, N-hydroxy-5-norbornene-2,3-dicarboximide perfluorobutanesulfonate, and N-hydroxy-5-norbornene-2,3-dicarboximide trifluoromethanesulfonate; and naphthalene-based non-ionic PAGs such as N-hydroxynaphthalimide perfluorooctanesulfonate, N-hydroxynaphthalimide perfluorobutanesulfonate and N-hydroxynaphthalimide trifluoromethanesulfonate.

Some additional classes of PAGs include: triarylsulfonium perfluoroalkanesulfonates, such as triphenylsulfonium perfluorooctanesulfonate, triphenylsulfonium perfluorobutanesulfonate and triphenylsulfonium trifluoromethanesulfonate; triarylsulfonium hexafluorophosphates (or hexafluoroantimonates), such as triphenylsulfonium hexafluorophosphate and triphenylsulfonium hexafluoroantimonate; triaryliodonium perfluoroalkanesulfonates, such as diphenyliodonium perfluorooctanesulfonate, diphenyliodonium perfluorobutanesulfonate, diphenyliodonium trifluoromethanesulfonate, di-(4-tert-butyl)phenyliodonium, perfluorooctanesulfonate, di-(4-tert-butyl)phenyliodonium perfluorobutanesulfonate, and di-(4-tert-butyl)phenyliodonium trifluoromethanesulfonate; and triaryliodonium hexafluorophosphates (or hexafluoroantimonates) such as diphenyliodonium hexafluorophosphate, diphenyliodonium hexafluoroantimonate, di-(4-tert-butyl)phenyliodonium hexafluorophosphate, and di-(4-tert-butyl)phenyliodonium hexafluoroantimonate. Suitable PAGs are not limited to those specifically mentioned above. Combinations of two or more PAGs may be used as well.

The fluorinated photopolymer composition may optionally include additives such as stabilizers, coating aids, light absorbers, acid scavengers ("quenchers") and the like.

The fluorinated photopolymer composition of the present disclosure may be applied to a substrate using any method suitable for depositing a photosensitive liquid material. For example, the composition may be applied by spin coating, curtain coating, bead coating, bar coating, spray coating, dip coating, gravure coating, ink jet, flexography or the like. The composition may be applied to form a uniform film or a patterned layer of unexposed photopolymer. Alternatively, the photopolymer can be applied to the substrate by transferring a preformed fluorinated photopolymer layer (optionally patterned) from a carrier sheet, for example, by lamination transfer using heat, pressure or both. In such an embodiment, the substrate or the preformed photopolymer layer may optionally have coated thereon an adhesion promoting layer.

Figure 2:
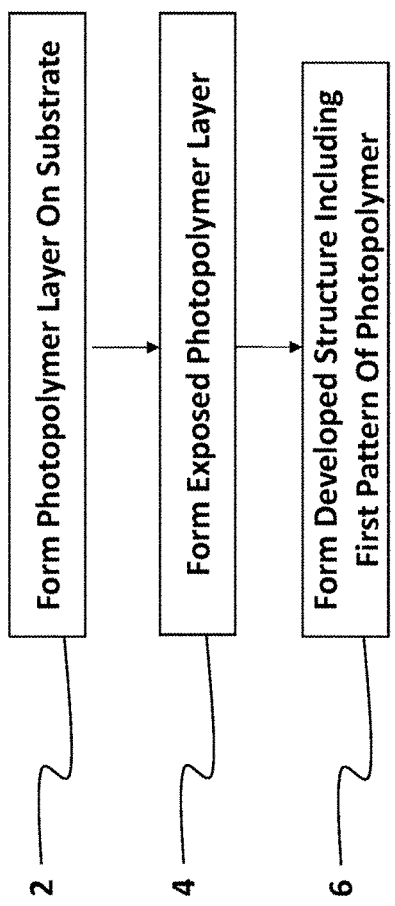
FIG. 2 is a flow chart depicting the steps in an embodiment of the present disclosure.

As previously mentioned, the composition of the present disclosure has many possible uses, many of which may involve photopatterning. A flow diagram for a photopatterning embodiment of the present disclosure is shown in FIG. 2, and includes the step 2 of forming a photopolymer layer on a substrate. A device substrate may optionally be a multilayer structure having a rigid or flexible support and one or more additional patterned or non-patterned layers. In an embodiment, the device substrate includes one or more layers of one or more active organic materials that may optionally be in direct contact with the photopolymer layer.

In step 4, the photopolymer layer is exposed to patterned radiation within the spectral sensitivity range of the photopolymer (e.g., light in a range of 300 nm to 450 nm), thereby forming an exposed photopolymer layer. The patterned radiation forms areas of differential developability due to some chemical or physical change caused by the radiation exposure, in particular, to the reacted solubility-altering reactive groups. Patterned radiation can be produced by many methods, for example, by directing exposing light through a photomask and onto the photopolymer layer. Photomasks are widely used in photolithography and often include a patterned layer of chrome that blocks light. The photomask may be in direct contact or in proximity. When using a proximity exposure, it is preferred that the light has a high degree of collimation if high resolution features are desired. Alternatively, the patterned light can be produced by a projection exposure device. In addition, the patterned light can be from a laser source that is selectively directed to certain portions of the photopolymer layer.

In step 6, a developed structure is formed that includes a first pattern of photopolymer. This can be done by contacting the exposed photopolymer layer to a developing agent. During development, a portion of the exposed photopolymer layer is removed in accordance with the patterned light. Depending on the nature of the chemical or physical change caused by the patterned light and choice of developing agent, the developing agent may dissolve the unexposed portion (negative working resist) or it may dissolve the exposed portion (positive working resist). In either case, it leaves behind a developed structure having a first pattern of photopolymer that covers the substrate and a complementary second pattern of uncovered substrate corresponding to the removed portion of photopolymer. By uncovered substrate, it is meant that the surface of the substrate is substantially exposed or revealed to a degree that it may optionally be subjected to further treatments. Contacting the exposed photopolymer layer can be accomplished by immersion into the developing agent or by coating it with the developing agent in some way, e.g., by spin coating or spray coating. The contacting can be performed multiple times if necessary. In an embodiment, the developing agent includes at least 50% by volume of one or more fluorinated solvents. In an embodiment, the developing agent includes at least 90% by volume of one or more hydrofluoroether solvents. Although formation of the developed structure could be the last patterning step if the photopolymer layer is intended to remain on or in the device, the developed structure may be subjected to further steps as described below.

The developed structure may optionally be subjected to further treatments, depending on the nature of the device. For example, the structure may be treated to etch a portion of the uncovered substrate (wherein the photopolymer acts as an etch barrier), treated to modify a property of the uncovered substrate or photopolymer, coated with an additional material layer and contacted with a stripping agent to remove the first pattern photopolymer and overlying additional material (so called "lift off" process), and the like. In an embodiment, the stripping agent includes at least 50% by volume of one or more fluorinated solvents. In an embodiment, the stripping agent includes at least 90% by volume of one or more hydrofluoroether solvents. In an embodiment, the stripping agent comprises a protic solvent or both a hydrofluoroether and a protic solvent. When using such mixtures, the protic solvent may be provided in a range of 0.1% to 50% by volume, or alternatively, 0.5% to 20% by volume, or alternatively 1% to 5% by volume. Some non-limiting examples of such further treatments can be found in U.S. patent application Ser. No. 14/291,692.

Although not limited, the present disclosure can be used to form devices having a layer of sensitive, active organic material (see above). Such devices may include electronic devices such as organic TFTs, touch screens, OLED lighting and displays, e-readers, LCD displays, solar cells, sensors and bioelectronics devices. These devices are typically multilayer structures having numerous other layers such as dielectric layers, optical layers, conductors and a support. Devices may include non-electronic devices such as optical, medical, and biological devices having some patterned active organic material, but that do not require an electrical conductor or semiconductor to operate (e.g., lenses, color filter arrays, down- or up-conversion filters, medical/biological test strips and the like). The device substrate onto which the fluorinated photopolymer is provided may include a single layer of a support material or may include a multilayer structure having a support and numerous additional layers. The substrate surface is not necessarily planar. The substrate and support are optionally flexible. Support materials include, but are not limited to, plastics, metals, glasses, ceramics, composites and fabrics.

In an embodiment, the fluorinated photopolymer of the present disclosure may be used as a photoresist, but as described above, there are many possible alternative uses. Some non-limiting examples are described below.

In an embodiment, the fluorinated photopolymer of the present disclosure may be used as an electrically insulating layer in an electronic device. For example, it may act as an insulating layer in a wire, a TFT structure, a touch screen, an RFID device, a sensor, a capacitor, a photovoltaic device and the like.

In an embodiment, the present fluorinated photopolymer may be used as a partition structure that separates light-emitting areas of a display or lighting device, e.g., as described in U.S. Pat. No. 6,693,296 or in U.S. Pat. No. 5,701,055. Some examples of useful light-emitting materials include organic light-emitting materials, such as those used in OLED devices, and semiconductor nanoparticles, such as quantum dots formed from colloidal semiconductor nanocrystals, particularly III/V or II/VI semiconductors.

In an embodiment, the present fluorinated photopolymer may be patterned to form a plurality of wells that may be used for many possible purposes, e.g., wells that are capable of containing a display material. For example, the fluorinated photopolymer may form banks and wells as described in US 2005/0196969, wherein the wells are filled with a solution-based organic light emitting material. Such filling can optionally be by ink jet. Other display materials may be added include liquid crystal material, electrophoretic material, a semiconductor nanoparticle material, a color filter material, and the like.

In an embodiment, the present fluorinated photopolymer may be used to form at least a portion of a barrier layer in a water- or solvent-sensitive device. Organic semiconductors and organic light-emitting materials in particular are often very sensitive to water. A barrier layer can be coated over a device as a single layer or as multiple layers and may optionally be part of an alternating photopolymer/inorganic oxide multilayer barrier structure. Similarly, a bioelectronic device such as a biosensor, an ion pump, an electrochemical transistor, a drug delivery device and the like may use the present fluorinated photopolymer as one or more structural or barrier layers. In some embodiments, e.g., implantable bioelectronic devices, an outer coating may be particularly beneficial.

The photochemical "contrast" of the present fluorinated photopolymer system can be an important factor that depends both upon the photopolymer and upon the developing agent. In an embodiment, the developing agent comprises at least a first fluorinated solvent, preferably a hydrofluoroether. Higher contrast is typically preferred, as it generally results in straighter sidewalls for imaged areas and overall better discrimination between imaging light and stray light for improved feature resolution. In embodiments wherein the photopolymer sidewalls are desired to be close to vertical, it is desirable that the maximum contrast be at least 1.5, preferably at least 1.9 and more preferably at least 2.1 (a method of measuring contrast is described below).

To study contrast, the following method was generally used. A subject fluorinated photopolymer was spin coated onto a silicon wafer and soft-baked on a hot plate for 1 min at 90° C. The film thickness was generally in a range of about 1 to 1.5 um. An optical 22-step tablet (~0.15 density units per step) was laid on top of the wafer and the resist was exposed to 365 nm radiation using a 16 W black light lamp or a Pluvex 1410 UV exposure unit and light intensity at 365 nm was determined using a General UV513AB meter. The maximum exposure dose was typically about 175 mJ/cm$^2$, but higher doses were sometimes used. The wafer was post-exposure baked (PEB) on a hot plate for 1 min at 90° C. to activate the switching reaction. The film thickness was then immediately measured in 24 areas (steps). In addition to the 22 areas of the step tablet, the maximum exposure dose was measured just outside of the step tablet area (point 1) as well as a minimum exposure dose area (covered by a metal disc) that received no exposure (point 24).

Five minutes after the PEB, the wafer was contacted with ~10 mL of a developer solution by forming a "puddle" over the wafer and spin-dried after the target time was reached. The time of each puddle and number of puddles depended on the system. After each puddle, the film thicknesses were measured in the same 24 areas. Film thicknesses after each puddle were normalized to the starting thickness and plotted versus log Exposure (log(E)) to create a set of contrast curves. The contrast between each point was calculated using equation 1:

$$\text{Contrast} = [\Delta \text{ normalized thickness}]/[\Delta \log(E)] \quad \text{(Eq. 1)}$$

Figure 3:
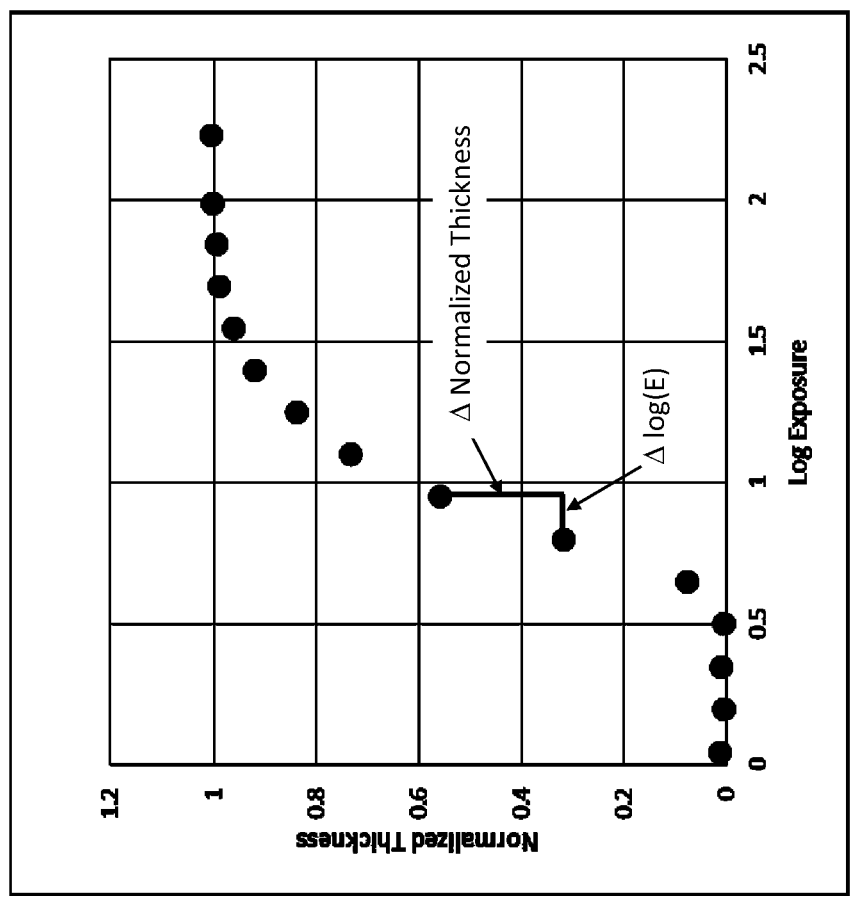
FIG. 3 is a representative plot of normalized thickness vs. log (exposure) used to determine photopolymer contrast.

The highest calculated contrast (the "maximum contrast") for each curve was determined. FIG. 3 shows an example graph of normalized thickness vs. log(E)—for clarity, only the first 16 points are shown. Other parameters can also be determined as desired such as "0.5 speed point" (exposure dose at normalized density=0.5), "Emax erosion" (normalized thickness loss of the maximum exposure point 1), "time to clear" (time it takes for the minimum exposure to be fully removed), and "time to strip" (time it takes for maximum exposure to be fully removed).

Another useful parameter is the "develop/strip exposure latitude" factor which is the ratio of the minimum exposure not stripped in a stripping agent to the minimum exposure to hold at least 75% of its feature height in developer. In systems that require subsequent stripping of the photopolymer, this factor provides a measure for the useful exposure window that will provide both good development and facile stripping. In an embodiment, the develop/strip exposure latitude is at least 2.

The developing agent comprises at least a first fluorinated solvent, preferably a hydrofluoroether. In an embodiment, the first fluorinated solvent is the only solvent in the developing agent. This can be advantaged because it is a simple solution to prepare and control in a manufacturing environment.

In an alternative embodiment, the developing agent comprises a mixture of first and second fluorinated solvents. In a particularly useful embodiment, at least one of the solvents is a hydrofluoroether. In a preferred embodiment, both solvents are hydrofluoroethers. It should be noted that, although either or both of the first and second solvents can each be an isomeric mixture (e.g., HFE-7100, HFE-7200 or any fluorinated solvent comprising multiple stereoisomers), the first and second solvents are not isomeric to each other.

It has been found that in certain embodiments, development time can be reduced and contrast adjusted into a desired range more quickly by using a mixture of first and second fluorinated solvents, particularly first and second hydrofluoroethers. Another advantage is that using a mixture of commercially available fluorinated solvents eliminates the need to design and tailor a special fluorinated solvent to match a particular fluorinated photopolymer or vice versa in order to achieve the desired contrast range in a target development time.

In an embodiment a fluorinated photopolymer composition of the present disclosure includes a mixture of a branched fluorinated photopolymer and a non-branched photopolymer. In some embodiments, branching has been found to increase the film contrast, but it may sometimes increase the tendency for film delamination at low exposures, i.e., exposures that are just enough to cause some solubility change. This can be controlled in a manufacturing environment by using proper exposure doses and optical systems. However, it has been unexpectedly found that addition of some non-branched photopolymer to the branched photopolymer can form a film that still has high contrast but also has less propensity to delaminate, which can relax some of the optical exposure tolerances. In some embodiments of cross-linking systems, the presence of some non-branched fluorinated crosslinkable photopolymer can reduce the amount of Emax erosion during development. In an embodiment, the percent by weight of the non-branched fluorinated photopolymer to the total amount of non-branched and branched photopolymer is in a range of 5 to 60%.

REPRESENTATIVE EMBODIMENTS

Some non-limiting embodiments of the present disclosure include, but are not limited to the following.

1. A fluorinated photopolymer composition, comprising:
a branched copolymer comprising a branching unit, a first repeating unit having a fluorine-containing group, and a second repeating unit having a solubility-altering reactive group; and
a fluorinated solvent.

2. The composition of embodiment 1 further including a sensitizing dye.

3. The composition of embodiment 2 wherein the sensitizing dye is attached to the branched copolymer as an additional repeating unit.

4. The composition according to any one of embodiments 1-3 wherein the copolymer includes a chain-terminating, sulfur- or bromine-containing group.

5. The composition according any one of embodiments 1-4 wherein the mole % of branching units relative to the total of all copolymer units is in a range of 0.5 to 10%.

6. The composition according to any one of embodiments 1-5 wherein the mole % of branching units relative to the total of all copolymer units is in a range of 1 to 6%.

7. The composition according to any one of embodiments 1-6 wherein the total fluorine content of the copolymer is in a weight range of 10 to 55%.

8. The composition according to any one of embodiments 1-7 wherein the solubility-altering reactive group is a cross-linkable group.

9. The composition according to any one of embodiments 1-7 wherein the solubility-altering reactive group is a carboxylic or sulfonic acid-forming precursor group.

10. The composition according to any one of embodiments 1-7 wherein the solubility-altering reactive group is an alcohol-forming precursor group.

11. The composition according to any one of embodiments 1-10 further comprising a photo-acid generator compound.

12. The composition according to embodiment 11 wherein the photo-acid generator compound is non-ionic.

13. The composition according to embodiment 11 or 12 wherein the photo-acid generator compound has one or more fluorine atoms.

14. The composition according to any one of embodiments 1-13 wherein the branching unit has at least two branch points.

15. The composition according to any one of embodiments 1-14 wherein the branched copolymer is formed from a first monomer having the fluorine-containing group, a second monomer having the solubility-altering reactive group and a branching monomer having at least two polymerizable sites.

16. The composition according to any one of embodiments 1-15 wherein the fluorinated solvent is a hydrofluoroether.

17. The composition according to any one of embodiments 1-16 wherein the fluorine-containing group is a fluoroalkyl.

18. A method of patterning a device, comprising:
forming a photopolymer layer on a device substrate, the photopolymer layer including a branched copolymer comprising a branching unit, a first repeating unit having a fluorine-containing group, and a second repeating unit having a solubility-altering reactive group;
exposing the photopolymer layer to patterned radiation to form an exposed photopolymer layer; and
contacting the exposed photopolymer layer with a developing agent to remove a portion of the exposed photopolymer layer in accordance with the patterned light, thereby forming a developed structure having a first pattern of photopolymer covering the device substrate and a complementary second pattern of uncovered substrate corresponding to the removed portion of photopolymer, the developing agent comprising a first fluorinated solvent.

19. The method according to embodiment 18 wherein the photopolymer layer is provided from a composition according to any one of embodiments 1-17.

20. The method according to embodiment 18 or 19 further comprising contacting the first pattern of photopolymer with a stripping agent, different in composition from the developing agent, the stripping agent comprising a second fluorinated solvent.

21. The method according to any of embodiments 18-20 wherein at least the first fluorinated solvent is a hydrofluoroether.

22. The method according to any of embodiments 18-21 wherein the device is an OLED device and the device substrate comprises one or more layers of an organic OLED materia.

23. The method according to any of embodiments 18-21 wherein the device is an organic TFT device and the device substrate comprises one or more layers of an organic semiconductor material.

24. The method according to any of embodiments 18-21 wherein the device is a bioelectronic device and the device substrate comprises at least an organic conductor material, an organic semiconductor material or a biological material.

EXAMPLES

Comparison Composition 1

A copolymer not having branching units was formed from the polymerization of: 1H,1H,2H,2H-perfluorooctyl methacrylate ("FOMA") as a first monomer having the fluorine-containing group, t-butyl methacrylate ("TBMA") as a second monomer having the solubility-altering reactive group and 9-anthracenylmethyl methacrylate ("AMMA") as a monomer having a sensitizing dye. The relative ratios of the three monomers were 49.9/48.0/2.1 mol %, respectively, and the polymerization was carried out in a hydrofluoroether solvent. The total fluorine content of the copolymer was 42.5% by weight relative to the total copolymer weight. Comparison Composition 1 further included 0.8 wt % PAG (relative to the total copolymer weight), added to the solution. The following procedure can be used.

A clean, dry 1 L four-neck jacketed reactor was equipped with a Teflon-blade mechanical stirrer, a reflux condenser having a mineral oil bubbler, a nitrogen inlet (the height of which could be adjusted to be below the surface of the reaction solution), and a programmable constant temperature bath (CTB) attached to the reactor jacket. To the reactor was charged FOMA (177.2 g, 0.410 mol), AMMA (4.7 g, 0.017 mol, from Osakashinyaku Co., Ltd) TBMA (56.0 g, 0.394 mol), AIBN as a radical chain initiator (4.65 g, 0.028 mol, 3.4 mol % relative to total moles of monomers) and Novec™ 7600 solvent (460.9 g). The nitrogen inlet was placed below the surface of the solution, and with good stirring, the reaction solution was sparged with nitrogen for 1 h. During the nitrogen sparge, the CTB was pre-warmed to 78° C. with the flow to the reactor jacket turned off. When the sparge was complete, the gas inlet tube was raised above the solution level and the nitrogen flow was reduced to maintain a slow flow through the system during the reaction. The valves between the pre-heated CTB and the reactor were opened and the reaction solution was stirred with heating for 18 h. The CTB was set to 21° C., and when the polymer solution was cooled, a total of 1283.7 g of Novec™ 7600 was added to the polymer solution to rinse it out of the reactor and to achieve a suitable viscosity for coating operations. A sample of the polymer solution could be removed at that point and either stripped of solvent or precipitated in cold methanol to provide a sample for analytical testing. Under yellow lights, CGI 1907 ("ONPF") from BASF (1.9032 g, 2.683 mmol) was added as the PAG. The PAG dissolves in the photoresist polymer solution over approximately 30 minutes. The light-sensitive solution was filtered repeatedly using nitrogen pressure through a 0.05 micrometer cartridge filter to provide a solution for coating. Other comparative polymers discussed below can be prepared in a manner similar to that used for Comparison Composition 1.

Inventive Composition 1

A copolymer similar to that of Comparison Composition 1 was prepared, but further including a branching monomer ethylene glycol dimethacrylate ("EGDMA") and prepared in the presence of 1-dodecanethiol ("DDT") as a chain transfer agent and using 2,2'-azodi(2-methylbutyronitrile) ("AMBN") as the radical chain initiator. The relative ratios of FOMA/TBMA/AMMA/EGDMA were 47.1/47.1/1.9/4.0 mol %, respectively, and polymerization was carried out in a hydrofluoroether solvent. The total fluorine content of the copolymer was 41.0% by weight relative to the total copolymer weight. Inventive Composition 1 further included 3.0 wt % PAG relative to the total copolymer weight. The following procedure can be used.

A jacketed reactor was charged with 67.7 g HFE-6512 solvent, 20.0 g FOMA (0.046 mol), 6.58 g TBMA (0.046 mol), 0.77 g EGDMA (0.0039 mol), 0.51 g AMMA (0.002 mol), and 0.79 g DDT (0.0039 mol). The mixture was deaerated by sparging with nitrogen for 20 min followed by addition of 0.37 g AMBN (0.0019 mol, 2.0 mol % relative to total moles of monomers). The reaction temperature was raised to 80° C. with stirring and held for 18 hours followed by cooling to room temperature. The homogeneous solution was rinsed out of the reactor with 48 g additional HFE-6512 in three portions to form a stock solution having 20.0% by weight solids. A light-sensitive solution at 14% by weight solids was prepared by combining 21.0 g of the above stock solution with 9.0 g HFE-6512 and adding 3.0 wt % PAG (CGI 1907) relative to the total copolymer weight. Other example polymers discussed below can be prepared in a manner similar to Inventive Composition 1. Unless otherwise noted, moles of the chain transfer agent was kept approximately equal to moles of branching agent.

Photopatterning Evaluation of Comparison Composition 1 and Inventive Composition 1

A silicon wafer was primed by vapor depositing HMDS. Each fluorinated photopolymer composition was spin coated onto the silicon wafer and then "soft baked" at 90° C. for 60 seconds. The photopolymer layer was approximately 1.0 to 1.5 µm thick. The photopolymer was exposed through a reticle to patterned "i-line" radiation @ 365 nm with doses ranging from 40 mJ/cm$^2$ to 880 mJ/cm$^2$. This was followed by post-exposure baking at 90° C. for 60 seconds. The exposed photopolymer was then developed in a mixture of HFE-7300 (97% vol)/HFE-7600 (3% vol) to remove the unexposed portion and to form a photopolymer pattern on the substrate. The exposed photopolymer pattern was then stripped using HFE-7600. Both development and stripping were performed by applying about 10 mL of developer or stripper onto the photopolymer to form a "puddle". After an appropriate puddle "dwell time", the wafer was spun dry. If necessary, the procedure was repeated. The dwell time and number of puddles for each polymer is discussed below.

Table 1 shows various lithographic performance data for the two compositions, Comparison Composition 1 (Comp. 1) and Inventive Composition 1 (Example 1). "Time to Clear" refers to the time it takes to clear unexposed photopolymer. In the case of Comp. 1, development required two puddles of developer, each at 45 sec dwell time. However, in the case of Example 1, two puddles of just 10 sec dwell time each were required. Thus, the unexposed branched copolymer is much more easily developed than the comparison. "Minimum dose to form useful image" refers to the ability to form useful 5 micron lines upon development. A useful image is formed from Comp. 1 at less than 40 mJ/cm$^2$ (the lowest exposure setting) and in Example 1 at 166 mJ/cm$^2$. Although Example 1 required a higher exposure dose, the dose is not unreasonably high and the development time is much less than that for Comp. 1, so the tradeoff may be advantageous in some embodiments. "Diffusion Dose" refers to the exposure at or above which significant line broadening occurs. In Comp. 1, diffusion is observed at or above about 61 mJ/cm$^2$ whereas in Example 1, it is not observed until 663 mJ/cm$^2$. Thus, Example 1 has a large, useful resolution "window" or latitude of 166 to 663 mJ/cm$^2$. "Maximum dose stripped" refers to the maximum exposure removed by the stripping step under conditions set forth in Table 1. As seen in Table 1, even the highest exposures of Example 1 were easily removed in just one 45 sec puddle. In contrast, exposures above 530 mJ/cm$^2$ for Comp. 1 did not strip even after two 45 sec puddles. The authors have generally observed that polymers with higher % fluorine by weight are often more soluble in fluorinated solvents than polymers with lower % fluorine. Even though the copolymer of Inventive Composition 1 has lower total % fluorine by weight relative to the copolymer of Comparison Composition 1, it is surprisingly much more readily solubilized into fluorinated solvents.

In an embodiment, the branched fluorinated photopolymers of the present disclosure have improved development rate in fluorinated solvents. In an embodiment, the branched fluorinated photopolymers of the present disclosure have improved stripping rate in fluorinated solvents. In an embodiment, the branched fluorinated photopolymers of the present disclosure have resolution exposure latitude when processed in fluorinated solvents.

TABLE 1

| Sample | Time to Clear (# puddles/ dwell time) | Minimum dose to form useful image (mJ/cm$^2$) | Diffusion Dose (mJ/cm$^2$) | Maximum Dose Stripped (mJ/cm$^2$) | Stripping conditions (# puddles/ dwell time) |
|---|---|---|---|---|---|
| Comp. 1 | 2/45 sec | <40 | 61 | 530 | 2/45 sec |
| Example 1 | 2/10 sec | 166 | 663 | >880 | 1/45 sec |

Example 2

A branched fluorinated photopolymer was spin coated onto a silicon wafer and then soft-baked at 90° C. for 60 seconds. The photopolymer layer was about 1.4 μm thick. The photopolymer solution included HFE-6512 as coating solvent, CGI 1907 as PAG (0.8% by wt relative to polymer wt), and a branched fluorinated polymer comprising a copolymer of FOMA, TBMA, ECPMA, EGDMA (ethylene glycol dimethylacrylate) and AMMA in mole ratios of 27.3, 30.4, 37.3, 3, and 2, respectively. The photopolymer had 28% by weight of fluorine relative to the polymer weight. Contrast curves were measured as described above using HFE-7200 as the developer. The process was then repeated for various mixtures of HFE-7200 and HFE-7600, and various parameters were determined as reported in Table 2. Note that maximum contrast values were only reported if the low exposures had fully been removed and when Emax erosion was less than 0.25. In Table 2, the pure HFE-7600 "time to clear" entry is "<30" sec. In fact, 95% of the polymer in the low exposure region was actually removed in the first 15 sec puddle. For reasons not fully understood, it is often observed that the first puddle, almost independent of puddle time, leaves a small residue of 0.05 to 0.10 of normalized thickness. If shorter puddle times were used, the time to clear would likely be much less than 30 sec. Surprisingly, adding just 10% HFE-7200 eliminates this residual effect. Also, the "time to strip" entries are estimates based on extrapolations from the data.

TABLE 2

| Solvent Ratio HFE7200/ HFE7600 | Time to Clear (sec) | Max Contrast (time, sec) | Emax Erosion (time, sec) | Time to Strip (sec) | Delamination (time, sec - step #) |
|---|---|---|---|---|---|
| 100/0 | 30 | 1.2 (30) | 0.05 (30) | n/a | Not observed |
|  |  | 1.8 (60) | 0.09 (60) |  |  |
|  |  | 2.1 (90) | 0.10 (90) |  |  |
| 95/5 | 30 | 1.9 (30) | 0.09 (30) | n/a | Not observed |
|  |  | 2.1 (60) | 0.11 (60) |  |  |
|  |  | 2.5 (90) | 0.13 (90) |  |  |
| 90/10 | 15 | 1.3 (15) | 0.05 (15) | n/a | Not observed |
|  |  | 1.8 (30) | 0.13 (30) |  |  |

TABLE 2-continued

| Solvent Ratio HFE7200/ HFE7600 | Time to Clear (sec) | Max Contrast (time, sec) | Emax Erosion (time, sec) | Time to Strip (sec) | Delamination (time, sec - step #) |
|---|---|---|---|---|---|
|  |  | 3.1 (60) | 0.17 (60) |  |  |
|  |  | 2.4 (90) | 0.20 (90) |  |  |
| 75/25 | 15 | 1.8 (15) | 0.10 (15) | n/a | Not observed |
|  |  | 1.8 (30) | 0.20 (30) |  |  |
|  |  |  | 0.27 (60) |  |  |
|  |  |  | 0.35 (90) |  |  |
| 10/90 | 15 | 2.0 (15) | 0.21 (15) | 105 (estimate) | Not observed |
|  |  |  | 0.27 (30) |  |  |
|  |  |  | 0.60 (60) |  |  |
|  |  |  | 0.85 (90) |  |  |
| 0/100 | <30 | n/a | 0.11 (15) | 110 (estimate) | Not observed |
|  |  |  | 0.34 (30) |  |  |
|  |  |  | 0.56 (60) |  |  |
|  |  |  | 0.82 (90) |  |  |

It is observed in Table 2 that the branched fluorinated photopolymer provides good contrast under a wide range of development conditions. Relative to pure HFE-7200, adding 5 to 10% HFE-7600 to the developing agent can boost contrast and reduce time to clear without any delamination. Increasing HFE-7600 to 25% or higher results in increased Emax Erosion and the solution becomes a more effective stripping agent than a developing agent. Note that the 10/90 HFE-7200/HFE-7600 mixture is just as effective as the pure HFE-7600 in stripping, and may be slightly advantaged in that the mixture leaves less residual in the first 15 sec puddle. Thus, the branched fluorinated photopolymer is also readily strippable in a solution comprising another fluorinated solvent or mixture under a wide variety of conditions.

Comparison 2

A non-branched fluorinated photopolymer was spin coated onto a 2 cm×2 cm silicon chip and then soft-baked at 90° C. for 60 seconds. The photopolymer solution included HFE-7600 as coating solvent, CGI 1907 as PAG (0.8% by wt relative to polymer wt), and a non-branched fluorinated polymer (similar to Example 2, but not branched) comprising a copolymer of FOMA, TBMA, ECPMA and AMMA in mole ratios of 28.3, 31.4, 38.3, and 2, respectively. The photopolymer had 28.8% by weight of fluorine relative to the polymer weight. When contacted with HFE-7200, the dissolution rate was determined to be about 10 nm/sec, and even with extended development times in HFE-7200, a residual film remained. The polymer from Example 2, however, had a dissolution rate of 46 nm/sec, and as previously described, cleared fully. Thus, even though the Comparison 2 photopolymer had slightly higher % fluorine by weight, its solubility in HFE solvent was much lower than Example 2.

Example 3

A fluorinated photopolymer was spin coated onto a silicon wafer and then soft-baked at 90° C. for 60 seconds. The photopolymer layer was about 1.4 μm thick. The photopolymer solution included HFE-6512 as coating solvent, CGI 1907 as PAG (0.8% by wt relative to polymer wt), and a branched polymer comprising a copolymer of FOMA, TBMA, ECPMA, EGDMA and AMMA in mole ratios of 50, 11.5, 33.5, 3, and 2, respectively. The photopolymer had 40.5% by weight of fluorine relative to the polymer weight. Contrast curves were measured as described above using HFE-7300 as the developer and various parameters were determined as reported in Table 3. In this example, the maximum exposure dose was 108 mJ/cm². Mixed solvent developers were not tested.

TABLE 3

| Solvent | Time to Clear (sec) | Max Contrast (time, sec) | Emax Erosion (time, sec) | Time to Strip (sec) | Delamination (time, sec) |
|---|---|---|---|---|---|
| HFE-7300 | 30 | 2.4 (30) 5.9 (60) 6.6 (90) | n/a | n/a | Yes (60) Yes (90) |

Table 3 shows that the branched fluorinated photopolymer provides good contrast in 30 sec using HFE-7300. Even higher contrast (above 5) is observed at 60 sec and 90 sec development time, but the photopolymer yielded delamination in low to moderate exposure steps. As mentioned previously, such delamination can be controlled by ensuring the imaged areas receive only high exposure, but keeping the development time to about 30 sec provides wider exposure latitude. Thus, the branched fluorinated photopolymer is an effective photoresist as long as some care is taken to avoid delamination with extended development times.

Comparison 3

A non-branched fluorinated photopolymer was spin coated onto a 2 cm×2 cm silicon chip and then soft-baked at 90° C. for 60 seconds. The photopolymer solution included HFE-7600 as coating solvent, CGI 1907 as PAG (0.8% by wt relative to polymer wt), and a non-branched fluorinated polymer (similar to Example 3, but not branched) comprising a copolymer of FOMA, TBMA, ECPMA and AMMA in mole ratios of 51, 12.5, 34.5 and 2, respectively. The photopolymer had 41.0% by weight of fluorine relative to the polymer weight. When contacted with HFE-7300, the dissolution rate was determined to be about 15 nm/sec. The polymer from Example 3, however, was found to have a dissolution rate of 59 nm/sec, about 4× higher than Comparison 3. Thus, even though the non-branched Comparison 3 photopolymer had slightly higher % fluorine by weight, its solubility in HFE solvent was much lower than branched Example 3.

Example 4

A fluorinated photopolymer was spin coated onto a silicon wafer and then soft-baked at 90° C. for 60 seconds. The photopolymer layer was about 1.1 μm thick. The photopolymer solution included a HFE-6512 as coating solvent, CGI 1907 as PAG (0.8% by wt relative to polymer wt), and a branched polymer comprising copolymer of FOMA, TBMA, ECPMA, EGDMA and AMMA in mole ratios of 36.3, 36.3, 22.4, 3, and 2, respectively. The photopolymer had 34.3% by weight of fluorine relative to the polymer weight. Contrast curves were measured using HFE-7200 as the developer and various parameters were determined as reported in Table 4. In this example, the maximum exposure dose was about 175 mJ/cm².

TABLE 4

| Solvent | Time to Clear (sec) | Max Contrast (time, sec) | Emax Erosion (time, sec) | Time to Strip (sec) | Delamination (time, sec) |
|---|---|---|---|---|---|
| HFE-7200 | 15 | 3.1 (15) 2.0 (30) 4.4 (60) 5.7 (90) | 0.03 (30) 0.05 (60) 0.07 (90) | n/a | slight (60) Yes (90) |

Table 4 shows that a good contrast is achieved in a developer contact time in a range of 15 sec to 60 sec using HFE-7200. Even higher contrast (above 5) is observed at 90 sec development time, but the photopolymer yielded delamination in the low to moderate exposure steps. There was slight delamination at 60 sec, but the observed amount in this step tablet test is manageable in a manufacturing setting where the exposure range is more limited. Thus, the branched fluorinated photopolymer is an effective photoresist as long as some care is taken to avoid delamination with extended development times.

Comparison 4

A non-branched fluorinated photopolymer was spin coated onto a 2 cm×2 cm silicon chip and then soft-baked at 90° C. for 60 seconds. The photopolymer solution included HFE-7600 as coating solvent, CGI 1907 as PAG (0.8% by wt relative to polymer wt), and a non-branched fluorinated polymer (similar to Example 4, but not branched) comprising a copolymer of FOMA, TBMA, ECPMA and AMMA in mole ratios of 37.3, 37.3, 23.4 and 2, respectively. The photopolymer had 35.1% by weight of fluorine relative to the polymer weight. When contacted with HFE-7200, the dissolution rate was determined to be about 5× lower than the dissolution rate of the photopolymer from Example 4. Thus, even though the non-branched Comparison 4 photopolymer had higher % fluorine by weight, its solubility in HFE solvent was much lower than branched Example 4.

Example 5

A fluorinated photopolymer was spin coated onto a silicon wafer and then soft-baked at 90° C. for 60 seconds. The photopolymer layer was about 1.4 μm thick. The photopolymer solution included a HFE-6512 as coating solvent, CGI 1907 as PAG (0.8% by wt relative to polymer wt), and a branched polymer comprising copolymer of FOMA, TBMA, ECPMA, EGDMA and AMMA in mole ratios of 50, 26, 20, 2 and 2, respectively. The photopolymer had 41.3% by weight of fluorine relative to the polymer weight. Contrast curves were measured using HFE-7200 as the developer and various parameters were determined as reported in Table 5. In this example, the maximum exposure dose was about 175 mJ/cm².

TABLE 5

| Solvent | Time to Clear (sec) | Max Contrast (time, sec) | Emax Erosion (time, sec) | Time to Strip (sec) | Delamination (time, sec) |
|---|---|---|---|---|---|
| HFE-7200 | 15 | 5.0 (15) 6.6 (30) 6.4 (60) | n/a | n/a | yes (60) yes (90) |

Table 5 shows that a very good contrast is achieved in a developer contact time of just 15 sec without any delamination. Even higher contrasts (above 5) are observed at 30 and 60 sec development times, but the photopolymer yielded delamination in the low to moderate exposure steps. Thus, the branched fluorinated photopolymer is an effective photoresist as long as some care is taken to avoid delamination with extended development times.

Example 5A

Contrast curves were determined for the same polymer as in Example 5, except that development was carried out using HFE-7300 instead of HFE-7200 and the starting film thickness was about 1.3 µm. In this example, the maximum exposure dose was 244 mJ/cm$^2$. The rate of development was found to be about 20 nm/sec and cleared in two 30 sec puddles of HFE-7300. After a total of 90 sec development, the film was treated 30 sec with HFE-7600 as a stripping agent. The develop/strip exposure latitude factor was found to be 7.8.

Comparision 5A.

In a manner similar to Example 5A, contrast curves were determined for a non-branched fluorinated photopolymer (similar to Example 5, but not branched), spin coated from a composition comprising a copolymer of FOMA, TBMA, ECPMA and AMMA in mole ratios of 51, 26.5, 20.5, and 2, respectively, in HFE-7600 coating solvent along with CGI 1907 as PAG (0.8% by wt relative to polymer wt). The photopolymer had 41.8% by weight of fluorine relative to the polymer weight. The rate of development was found to be about 14 nm/sec and cleared in three 30 sec puddles of HFE-7300. After a total of 120 sec development, the film was treated 30 sec with HFE-7600 as a stripping agent. The develop/strip exposure latitude factor was found to be only 1.4. This is a very small window to expose a film that holds in developer but is also removable in a stripping agent. Thus, the branched sample not only has a faster development rate in HFE solvent (despite lower % fluorine), the develop/strip exposure latitude is far greater than the non-branched analog.

Example 6

A fluorinated photopolymer was spin coated onto the silicon wafer and then soft-baked at 90° C. for 60 seconds. The photopolymer layer was about 1.3 µm thick. The photopolymer solution included a HFE-6512 as coating solvent, CGI 1907 as PAG (0.8% by wt relative to polymer wt), and a branched polymer comprising copolymer of FOMA, TBMA, ECPMA, EGDMA and AMMA in mole ratios of 46, 16.5, 33.5, 3 and 2, respectively. The photopolymer had 38.2% by weight of fluorine relative to the polymer weight. Contrast curves were measured using HFE-7300 as the developer and various parameters were determined as reported in Table 6. In this example, the maximum exposure dose was about 175 mJ/cm$^2$.

TABLE 6

| Solvent | Time to Clear (sec) | Max Contrast (time, sec) | Emax Erosion (time, sec) | Time to Strip (sec) | Delamination (time, sec) |
|---|---|---|---|---|---|
| HFE-7300 | 60 | 2.6 (60) 4.6 (90) 5.7 (150) | n/a | n/a | slight (90) Yes (150) |

Table 6 shows that a good contrast is achieved 60 sec using HFE-7300. At 90 sec, the contrast increases (4.6) with some slight delamination. At 150 sec the contrast is up to 5.7 and delamination has become more obvious in the low to moderate exposure steps. Thus, the branched fluorinated photopolymer is an effective photoresist as long as some care is taken to avoid delamination with extended development times.

Comparison 6

A non-branched fluorinated photopolymer was spin coated onto a 2 cm×2 cm silicon chip and then soft-baked at 90° C. for 60 seconds. The photopolymer solution included HFE-7600 as coating solvent, CGI 1907 as PAG (0.8% by wt relative to polymer wt), and a non-branched fluorinated polymer (similar to Example 6, but not branched) comprising a copolymer of FOMA, TBMA, ECPMA and AMMA in mole ratios of 46, 17.5, 34.5 and 2, respectively. The photopolymer had 38.9% by weight of fluorine relative to the polymer weight. When contacted with HFE-7300, the dissolution rate was determined to be about 4.4× lower than the dissolution rate of the photopolymer from Example 6. Thus, even though the non-branched Comparison 6 photopolymer had higher % fluorine by weight, its solubility in HFE solvent was much lower than branched Example 6.

Example 7

A fluorinated photopolymer was spin coated onto a silicon wafer and then soft-baked at 90° C. for 180 seconds. The photopolymer layer was about 0.9 µm thick. The photopolymer solution included a HFE-7600 as coating solvent, CGI 1907 as PAG (2.0% by wt relative to polymer wt), and a polymer comprising copolymer of FOMA, ECPMA, and EGDMA in mole ratios of 20, 76 and 4, respectively. The photopolymer had 21.2% by weight of fluorine relative to the polymer weight. Contrast curves were measured as described above using HFE-7600 as the developer and various parameters were determined as reported in Table 7. In this example, the maximum exposure dose was about 325 mJ/cm$^2$.

TABLE 7

| Solvent | Time to Clear (sec) | Max Contrast (time, sec) | Emax Erosion (time, sec) | Time to Strip (sec) | Delamination (time, sec) |
|---|---|---|---|---|---|
| HFE-7600 | 30 | 3.3 (30) | n/a | n/a | Not observed |

Table 7 shows that a good contrast is achieved for 30 sec contact time with HFE-7600. No delamination was observed. Thus, the branched fluorinated photopolymer is an effective photoresist. It can be stripped using, e.g., HFE-7600 or HFE-6512 to which a small amount (1 to 30% by volume) of a protic solvent is added, e.g., an alcohol such as IPA.

Comparison 7

A non-branched fluorinated photopolymer was spin coated onto a 2 cm×2 cm silicon chip and then soft-baked at 90° C. for 60 seconds. The photopolymer solution included HFE-7600 as coating solvent, CGI 1907 as PAG (0.8% by wt relative to polymer wt), and a non-branched fluorinated polymer (similar to Example 7, but not branched) comprising a copolymer of FOMA and ECPMA in mole ratios of 22 and 78, respectively. The photopolymer had 22.9% by weight of fluorine relative to the polymer weight. The coating quality of this non-branched fluorinated photopolymer was very poor in that the surface was extremely rough with a large amount of light scattering. Thus, the non-branched Comparison 7 polymer is unsuitable for photolithography.

Example 8

A branched fluorinated polymer was prepared in HFE-7600 comprising a copolymer of FOMA, THPOEMA, and EGDMA in mole ratios of 10, 86 and 4, respectively. The photopolymer had just 10.5% by weight of fluorine relative to the polymer weight. CGI 1907 was added to the solution at 2% by weight relative to the polymer. The dissolution rate of a layer of this photopolymer in HFE-7600 was determined to be at least 210 nm/sec (measured on unexposed photopolymer on a Si wafer by interferometry using a Filmetrics F20 Thin-Film Analyzer). A second branched THPOEMA polymer was prepared comprising a copolymer of FOMA, THPOEMA, and EGDMA in mole ratios of 20, 76 and 4, respectively. The photopolymer had 19.2% by weight of fluorine relative to the polymer weight. CGI 1907 was added to the solution at 2% by weight relative to the polymer. The dissolution rate of a layer of this photopolymer in HFE-7600 was determined to be about 560 nm/sec. There was significant thickness non-uniformity for these particular polymers for reasons unknown, which made obtaining reliable contrast curves difficult due to uncertainties in obtaining film thickness measurements. Still, the films appear to have high contrast and are believed to be suitable for use in many photolithographic applications. The maximum exposure step (325 mJ/cm$^2$ with post exposure bake of 3 min at 90° C.) stripped completely in less than 15 seconds using HFE-7600 having 20% by volume IPA for the first THPOEMA polymer. The second THPOEMA polymer stripped in less than 5 sec. Without branching, polymers with such low levels of FOMA have been found difficult to prepare in hydrofluoroether coating solvents.

Example 9

A branched photopolymer was prepared comprising a copolymer of FOMA, TBMA, AMMA and EGDMA in mole ratios of 23/72/2/3 respectively. The photopolymer had 26.6% fluorine by weight relative to the photopolymer. CGI 1907 was added to the solution at 2% by weight relative to the polymer. The dissolution rate of a layer of this photopolymer in HFE-7600 was determined to be about 280 nm/sec. A contrast curve was measured as described above using HFE-7600 as the developer (maximum exposure=175 mJ/cm$^2$, and the post exposure bake was 1 min at 90° C.). In HFE-7600, however, both exposed and unexposed features are removed. That is, HFE-7600 is an effective stripping agent without any protic solvent added with Emax stripped in about 100 sec.

A second contrast curve was measured using HFE-7200 as the developing agent. The dissolution rate of a layer of this photopolymer in HFE-7200 was determined to be about 42 nm/sec. The photopolymer had a maximum contrast of 1.6 at 30 s of development and 2.2 at 60 s of development. There was a small amount of dissolution of the Emax even in HFE-7200 developing agent, but even at 60 s of development, >85% of the Emax thickness was retained. Since no protic solvents are required (HFE-7600 can be used as sole stripping solvent), this photopolymer is suitable for use with a broad range of active organic materials.

Example 10

A series of fluorinated photopolymer compositions were prepared as summarized in Table 8 which shows the mole ratios of the various monomers along with the level of chain transfer agent used in the synthesis, in this case, 1-dodecanethiol (DDT). All polymers were prepared in HFE-7600 coating solvent and included CGI 1907 at 1% by weight relative to the polymer.

TABLE 8

Monomer and chain transfer agent mole ratios.

| Sample No. | FOMA | ECPMA | AMMA | EGDMA | DDT |
|---|---|---|---|---|---|
| 10-0-0 | 54.1 | 43.9 | 2.0 | 0 | 0 |
| 10-1-1 | 52.7 | 44.3 | 2.0 | 1.0 | 1.0 |
| 10-2-2 | 53.0 | 43.0 | 2.0 | 2.0 | 2.0 |
| 10-4-4 | 52.0 | 42.0 | 2.0 | 4.0 | 4.0 |
| 10-0-4 | 54.0 | 44.0 | 2.0 | 0.0 | 4.0 |
| 10-6-6 | 51.0 | 41.0 | 2.0 | 6.0 | 6.0 |
| 10-10-10 | 49.1 | 38.9 | 2.0 | 10.0 | 10.0 |

Contrast curves were obtained using HFE-7300 as the developer in a manner described previously using a maximum exposure of about 245 mJ/cm$^2$. Rates of dissolution (unexposed portion) and 0.5 speed points were calculated. In addition, the develop/strip exposure latitude factor was determined using HFE-7600 as the stripping agent (Stripper A), or in some cases, a mixture of HFE-6512 and IPA in a volume ratio of about 97/3 (Stripper B). The results are shown in Table 9.

TABLE 9

| Sample No. | Dissolution rate in HFE-7300 (nm/sec) | Development time (sec) | 0.5 speed point (mJ/cm$^2$) | Develop/strip exposure latitude | Stripper/time (sec) |
|---|---|---|---|---|---|
| 10-0-0 | 29 | 90 | 3.23 | 1.4 | A/30 |
|  |  |  |  | 4.0 | B/30 |
| 10-1-1 | 48 | 60 | 5.2 | 2.0 | A/30 |
|  |  |  |  | >38 | B/30 |
| 10-2-2 | 111 | 60 | 9.6 | 2.0 | A/30 |
|  |  |  |  | >20 | B/30 |
| 10-4-4 | >250 | 30 | 25.0 | 5.6 | A/30 |
|  |  |  |  | 9.8 | A/60 |
| 10-0-4 | >250 | 30 | 25.8 | 1.4 | A/30 |
|  |  |  |  | 1.4 | A/60 |
| 10-6-6 | >250 | 30 | 30.7 | >4.9 | A/15 |
| 10-10-10 | >250 | 15 | Image not holding | Not applicable | Not applicable |

The data in Table 9 show several things. First, as seen before, branching increases the development rate. There is also a shift in speed point that is not problematic until 10% branching (sample 10-10-10) wherein even the highest exposure is developing away, i.e., the image is not holding.

In this particular system for exposures less than 245 mJ/cm² branching should be kept less than 10%. One advantage of branching shown for all samples is that the develop/strip exposure latitude factor is significantly higher than for non-branched samples 10-0-0 and 10-0-4. Interestingly, the non-branched sample 10-0-4 which was prepared in the presence of 4% chain transfer agent has a dissolution rate and a speed point similar to the analogous branched sample 10-4-4. However, the develop/strip exposure latitude is the same as the non-branched sample 10-0-0, i.e., very low. It is believed that the chain transfer agent in the absence of branching agent may lower the molecular weight thereby increasing the development rate. Nevertheless, the key feature for improving develop/strip exposure latitude is the presence of the branching agent. Even just 1% of the branching agent significantly improves the develop/strip exposure latitude.

Example 11

A fluorinated photopolymer was spin coated onto a 2 cm×2 cm silicon chip and then soft-baked at 90° C. for 60 seconds. The polymer film was about 1.6 µm thick. The photopolymer solution included a HFE-7600 as coating solvent, CGI 1907 as PAG (1.0% by wt relative to polymer wt), and a polymer comprising copolymer of FOMA, ECPMA, EGDMA, and AMMA in mole ratios of 50, 38, 4, and 8, respectively. This is high level of sensitizing dye (AMMA). Half of the chip was exposed to 242 mJ/cm² UV light measured at 365 nm and given a post exposure bake of 1 min at 90° C. Three minutes after baking, the sample was developed in a developer having 92% by volume HFE-7300 and 8% by volume HFE-6512. The unexposed portion was found to have a dissolution rate of 150 nm/sec and was cleanly removed in 20 sec whereas the exposed portion showed no thickness diminution.

Comparison 11

A non-branched polymer similar to EXAMPLE 11 was spin coated onto a 2 cm×2 cm silicon chip and then soft-baked at 90° C. for 60 seconds. The polymer film was about 1.6 µm thick. The photopolymer solution included a HFE-7600 as coating solvent, CGI 1907 as PAG (1.0% by wt relative to polymer wt), and a polymer comprising copolymer of FOMA, ECPMA, and AMMA in mole ratios of 52, 40, and 8, respectively. It was found that the unexposed film would not adequately dissolve in the same developer used in Example 11. The dissolution rate was initially about 15 nm/sec, but the rate slowed with the formation of a non-uniform, hazy-looking film. Thus, the non-branched polymer having this high level of AMMA was not suitable as a photoresist under these conditions. Branching, as demonstrated by Example 11, can enable attachment of higher levels of low-solubility components such as AMMA without sacrificing photoimaging. Higher levels of photosensitizers can move the speed point to lower exposure doses. The higher light absorption also reduces the amount of light reaching underlying device substrate layers.

Example 12

A fluorinated photopolymer was spin coated onto a 2 cm×2 cm silicon chip and then soft-baked at 90° C. for 60 seconds. The polymer film was about 1.6 µm thick. The photopolymer solution included a HFE-7600 as coating solvent, CGI 1907 as PAG (3.0% by wt relative to polymer wt), and a polymer comprising copolymer of FOMA, TBMA, TMSOEMA (2-(trimethylsilyloxy)ethyl methacrylate) and EGDMA in mole ratios of 48, 29, 19 and 4, respectively. TMSOEMA is a monomer having an alcohol forming precursor group. Half of the chip was exposed to 495 mJ/cm² UV light measured at 365 nm and given a post exposure bake of 1 min at 90° C. Three minutes after baking, the sample was developed in HFE-7700. The unexposed portion was found to have a dissolution rate of 95 nm/sec and was removed in 30 sec whereas the exposed portion showed no thickness diminution. The sample was then treated with HFE-7300 which effectively stripped the exposed portion in just 30 sec.

Comparison 12

A non-branched fluorinated photopolymer was prepared and coated as in Example 12 except the composition included FOMA, TBMA, and TMSOEMA in mole ratios of 50, 30, and 20, respectively. This polymer showed no dissolution into HFE-7700 and would not develop. Thus, branching can enable entirely new combinations of HFE developers and strippers that are particularly mild on active organic materials and environmentally friendly.

Example 13

A fluorinated photopolymer was spin coated onto a 2 cm×2 cm silicon chip and then soft-baked at 90° C. for 60 seconds. The polymer film was about 2.0 µm thick. The photopolymer solution included a HFE-7600 as coating solvent, CGI 1907 as PAG (1.0% by wt relative to polymer wt), and a polymer comprising copolymer of FOMA, THPMA (2-tetrahydropyranyl methacrylate), ADMA (1-adamantyl methacrylate), EGDMA and AMMA in mole ratios of 48, 31, 15, 4 and 2, respectively. THPMA includes a very reactive carboxylic acid forming precursor group and ADMA has useful plasma etch resistance properties. Half of the chip was exposed to 242 mJ/cm² UV light measured at 365 nm and given a post exposure bake of 1 min at 90° C. Three minutes after baking, the sample was developed in HFE-7600. The unexposed portion was found to have a dissolution rate of 56 nm/sec whereas the exposed portion showed no thickness diminution.

Comparison 13

A non-branched fluorinated photopolymer was prepared and coated as in Example 13 except the composition included FOMA, THPMA, ADMA and AMMA in mole ratios of 48, 31, 15 and 2, respectively. This polymer had a dissolution rate of 16 nm/sec in HFE-7600, i.e., more than 4× slower than the branched version. Thus, branching can enable the incorporation of etch resistant functional groups to form a fluorinated photopolymer having improved development rates.

Example 14

A fluorinated photopolymer was spin coated onto a 2 cm×2 cm silicon chip and then soft-baked at 90° C. for 60 seconds. The polymer film was about 1.6 µm thick. The photopolymer solution included a HFE-7600 as coating solvent, CGI 1907 as PAG (1.0% by wt relative to polymer wt), and a polymer comprising copolymer of FOMA, THPMA (2-tetrahydropyranyl methacrylate), HEMA (2-hydroxyethyl methacrylate), EGDMA and AMMA in mole ratios of 46, 28, 20, 4 and 2, respectively. HEMA includes a polar alcohol group that can reduce the polymer solubility in HFE solvents. Half of the chip was exposed to 491 mJ/cm² UV light measured at 365 nm and given a post exposure bake of 1 min at 90° C. Three minutes after baking, the sample was developed in HFE-7600. The unexposed portion was found to have a dissolution rate of >270 nm/sec and was cleared in two 5 sec puddles, whereas the exposed portion showed no thickness diminution.

Comparison 14

Preparation of a non-branched fluorinated photopolymer similar to Example 14 was attempted with a target composition including FOMA, THPMA, HEMA and AMMA in mole ratios of 48, 30, 20 and 2, respectively. This polymer gelled during polymerization and was not useable. Thus branching can enable the incorporation of polar functional groups to form effective fluorinated photopolymers.

Example 15

A series of fluorinated photopolymer compositions were prepared as summarized in Table 10 which shows the mole ratios of the various monomers. In these tests, different branching agents were tested including BPADMA (bisphenol A dimethacrylate), DVB (1,4-divinyl benzene) and TMPTMA (trimethylpropane trimethacrylate). TMPTMA has three branching points. All polymers were prepared in HFE-7600 coating solvent and included CGI 1907 at 1% by weight relative to the polymer.

TABLE 10

Monomer ratios

| Sample No. | FOMA | ECPMA | AMMA | BPADMA | DVB | TMPTMA |
|---|---|---|---|---|---|---|
| 15-none | 54.1 | 43.9 | 2.0 | | | |
| 15-BPADMA | 52.0 | 42.0 | 2.0 | 4.0 | | |
| 15-DVB | 52.0 | 42.0 | 2.0 | | 4.0 | |
| 15-TMPTMA | 52.0 | 42.0 | 2.0 | | | 4.0 |

Contrast curves were obtained using either HFE-7300 as the developer (D1) or using a mixture of HFE-7300 and HFE-6512 in a volume ratio of about 97 to 3, respectively (D2) in a manner described previously using a maximum exposure of about 495 mJ/cm$^2$. Rates of dissolution (unexposed portion) and 0.5 speed points were calculated. In addition, the develop/strip exposure latitude factor was determined using HFE-7600 as the stripping agent (Stripper A), and alternatively, using a mixture of HFE-6512 and IPA in a volume ratio of about 97 to 3, respectively (Stripper B). The results are shown in Table 11.

TABLE 11

| Sample No. | Developer/ Dissolution rate (nm/sec) | Development time (sec) | 0.5 speed point (mJ/cm$^2$) | Develop/strip exposure latitude | Stripper/time (sec) |
|---|---|---|---|---|---|
| 15-none | D1/29 | 90 | 3.2 | 1.4 | A/30 |
| | | | | 4.0 | B/30 |
| 15-none | D2/60 | 40 | 2.6 | 1.4 | A/30 |
| | | | | 2.8 | B/30 |
| 15-BPADMA | D2/150 | 30 | 5.56 | 2.0 | A/30 |
| | | | | 5.6 | B/30 |
| 15-DVB | D1/>270 | 30 | 21.1 | 3.9 | A/30 |
| | | | | >10 | B/30 |
| 15-TMPTMA | D1/>270 | 30 | 21.8 | 2.8 | A/30 |
| | | | | >7 | B/30 |

The data in Table 11 show several things. First, as seen before, branching increases the development rate. There is also a shift in speed point that is not problematic within this set. One advantage of branching shown for all samples is that the develop/strip exposure latitude factor is significantly higher than for non-branched sample 15-none. This example shows that this advantage is common to a variety of branching agents.

Example 16

A branched fluorinated photopolymer was spin coated onto a 2 cm×2 cm silicon chip and then soft-baked at 90° C. for 60 seconds. The polymer film was about 1.2 μm thick. The photopolymer solution included a HFE-7600 as coating solvent, and a polymer comprising copolymer of FOMA, NBMA (o-nitrobenzyl methacrylate) and EGDMA in a molar ratio of 68, 30 and 2, respectively. The total fluorine content of the photopolymer was 46.1% by weight relative to the total copolymer weight. In this example, the polymer was first prepared in trifluorotoluene solvent, precipitated in methanol, and redissolved in HFE-7600. NBMA includes carboxylic acid forming precursor group that is not acid-catalyzed. NBMA is reasonably sensitive to 254 nm radiation, but also weakly sensitive to 365 nm. Half of the chip was exposed to 7.1 J/cm$^2$ UV light measured at 365 nm. No post exposure bake was required since this is not an acid-catalyzed system. The unexposed portion was found to have a dissolution rate of 52 nm/sec in HFE-7300 and cleared within two 15 sec puddles. The exposed portion showed a slight thickness diminution, but still retained about 90% of its original thickness.

Comparison 16

A non-branched fluorinated photopolymer was prepared and coated as in Example 16 except the composition included FOMA and NBMA in mole ratios of 70 and 30, respectively. This polymer had an initial dissolution rate of 3 nm/sec in HFE-7300, but slowed to near zero. The non-branched analog is unsuitable for imaging in HFE-7300 solvent. Thus, branching can enable the incorporation of non-acid-catalyzed switching groups to form a fluorinated photopolymer having improved development rates.

Example 17

A branched fluorinated photopolymer was spin coated onto a 2 cm×2 cm silicon chip and then soft-baked at 90° C. for 60 seconds. The polymer film was about 1.1 μm thick. The photopolymer solution included a HFE-7600 as coating solvent, and a polymer comprising copolymer of FOMA, GMA (glycidyl methacrylate), AMMA, and EGDMA in a molar ratio of 56.5, 39.5, 2 and 2, respectively. GMA includes an acid-catalyzed cross-linking group. The total fluorine content of the photopolymer was 45.0% by weight relative to the total copolymer weight. Half of the chip was exposed to 495 mJ/cm$^2$ UV light measured at 365 nm and the sample was given a post-exposure bake at 90° C. for 60 seconds. The unexposed portion was found to have a dissolution rate of 52 nm/sec in HFE-7300 and cleared within two 10 sec puddles. The exposed portion showed some thickness diminution, but still retained about 80% of its original thickness.

Comparison 17

A non-branched fluorinated photopolymer was prepared and coated as in Example 17 except the composition included FOMA, GMA and AMMA in mole ratios of 58, 40 and 2, respectively. This polymer was not soluble in HFE-7300 (rate ~0.3 nm/sec in unexposed area). The non-branched analog is unsuitable for imaging in HFE-7300 solvent. Thus, branching can enable the incorporation of acid-catalyzed cross-linking groups to form an effective fluorinated photopolymer system.

Example 18

A series of fluorinated photopolymer compositions were prepared as summarized in Table 12 which shows the mole ratios of the various monomers used. CINN is 2-cinnamoyloxyethyl methacrylate, which includes a photo crosslinking group (not acid-catalyzed). TRIS is methacryloxypropyltris (trimethylsiloxy)silane which includes a plasma etch resistant group. All polymers were prepared in HFE-7600 coating solvent and were sensitized to g,h,i-line UV radiation by dissolving 2,4-diethyl-9H-thioxanthen-9-one (4.5 wt % relative to the dry weight of the polymer in solution) in the polymer solution.

TABLE 12

| | Monomer ratios. | | | |
|---|---|---|---|---|
| Sample No. | FOMA | CINN | TRIS | EGDMA |
| 18-0 | 50.0 | 35.0 | 15.0 | 0 |
| 18-1 | 49.0 | 35.0 | 15.0 | 1.0 |
| 18-4 | 46.0 | 35.0 | 15.0 | 4.0 |

Contrast curves were obtained using HFE-7600 as the developer in a manner described previously using a maximum exposure of about 957 mJ/cm$^2$. All films developed rapidly and required only 20 sec development. Maximum contrast and 0.5 speed points were calculated and the results are shown in Table 13.

TABLE 13

| Sample No. | Contrast | 0.5 speed point (mJ/cm$^2$) |
|---|---|---|
| 18-0 | 1.2 | 75 |
| 18-1 | 2.5 | 252 |
| 18-4 | 2.9 | 444 |

It is clear that branching significantly improves contrast in this non-catalyzed, cross-linking film. Although branching shifts the speed point to higher energies, it is not expected to be problematic in most systems. Most of the contrast improvement is achieved with just 1% branching, although 4% branching provides an extra contrast boost and a useful film. In such non-catalyzed, cross-linking systems, the % branching is preferably in a range of 0.5 to 5%, inclusive.

The invention has been described in detail with particular reference to certain preferred embodiments thereof, but it will be understood that variations, combinations, and modifications can be effected by a person of ordinary skill in the art within the spirit and scope of the invention.

LIST OF REFERENCE NUMBERS USED IN THE DRAWINGS 2 form photopolymer layer on substrate step
4 form exposed photopolymer layer step
6 form developed structure step
10 branched copolymer
11 chain segment
12 chain segment
13 chain segment
14 chain segment
15 branching unit
16 branch point
17 branch point

The invention claimed is:

1. A composition, comprising:
a fluorinated photopolymer comprising a branched copolymer comprising a branching unit, a first repeating unit having a fluorine-containing group, and a second repeating unit having a solubility-altering reactive group, wherein the mole fraction of branching units relative to the total of all copolymer units is in a range of 0.5 to 10%, and wherein the solubility-altering reactive group is a carboxylic or sulfonic acid-forming precursor group, an alcohol-forming precursor group, or a cross-linkable group comprising a photo cross-linkable double bond or an acid-catalyzed cross-linkable cyclic ether or vinyloxy group, and wherein the branched copolymer is formed from a first monomer having the fluorine-containing group, a second monomer having the solubility-altering reactive group and a branching monomer having at least two polymerizable sites; and
a fluorinated solvent.

2. The composition of claim 1 further including a sensitizing dye.

3. The composition of claim 2 wherein the sensitizing dye is attached to the branched copolymer as an additional repeating unit.

4. The composition according to claim 1 wherein the copolymer includes a chain-terminating, sulfur- or bromine-containing group.

5. The composition according to claim 1 wherein the mole % of branching units relative to the total of all copolymer units is in a range of 1 to 6%.

6. The composition according to claim 1 wherein the total fluorine content of the copolymer is in a weight range of 10 to 55%.

7. The composition according to claim 1 wherein the solubility-altering reactive group is a cross-linkable group.

8. The composition according to claim 1 wherein the solubility-altering reactive group is a carboxylic or sulfonic acid-forming precursor group.

9. The composition according to claim 1 wherein the solubility-altering reactive group is an alcohol-forming precursor group.

10. The composition according to claim 1 further comprising a photo-acid generator compound.

11. The composition according to claim 1 wherein the fluorinated solvent is a hydrofluoroether.

12. The composition according to claim 1 wherein the fluorine-containing group is a fluoroalkyl.

13. A fluorinated photopolymer composition, comprising:
a branched copolymer comprising a branching unit, a first repeating unit having a fluorine-containing group, a second repeating unit having a solubility-altering reactive group and an additional repeating unit having an attached sensitizing dye; and
a fluorinated solvent.

14. The composition according to claim 13 wherein the mole fraction of branching units relative to the total of all copolymer units is in a range of 1 to 6%.

15. The composition according to claim 14 wherein the total fluorine content of the copolymer is in a weight range of 10 to 55%.

16. A fluorinated photopolymer composition, comprising:
a branched copolymer having a total fluorine content in a weight range of 10 to 55%, the copolymer comprising a branching unit, a first repeating unit having a fluorine-containing group, and a second repeating unit having a solubility-altering reactive group, wherein the mole % of branching units relative to the total of all copolymer units is in a range of 0.5 to 10%, and wherein the solubility-altering reactive group is a carboxylic or sulfonic acid-forming precursor group, an alcohol-forming precursor group, or a cross-linkable group comprising a photo cross-linkable double bond or an acid-catalyzed cross-linkable cyclic ether or vinyloxy group; and
a fluorinated solvent.

17. A fluorinated photopolymer composition, comprising:
a branched copolymer comprising a branching unit, a first repeating unit having a fluorine-containing group, and a second repeating unit having a solubility-altering reactive group, wherein the mole % of branching units relative to the total of all copolymer units is in a range of 0.5 to 10%, and wherein the solubility-altering reactive group is a cross-linkable group comprising a photo cross-linkable double bond or an acid-catalyzed cross-linkable cyclic ether or vinyloxy group; and
a fluorinated solvent.

* * * * *